(12) United States Patent
Brueckner et al.

(10) Patent No.: US 7,262,616 B2
(45) Date of Patent: Aug. 28, 2007

(54) APPARATUS, METHOD AND SYSTEM FOR TESTING ELECTRONIC COMPONENTS

(75) Inventors: Roger Brueckner, Phoenix, AZ (US); Michael Costello, Queen Creek, AZ (US); James Hopkins, Mesa, AZ (US); Rudolph Sterbenz, Chandler, AZ (US)

(73) Assignee: Telco Testing Systems LLC, Tempe, AZ (US)

( * ) Notice: Subject to any disclaimer, the term of this patent is extended or adjusted under 35 U.S.C. 154(b) by 46 days.

(21) Appl. No.: 11/328,451

(22) Filed: Jan. 10, 2006

(65) Prior Publication Data

US 2007/0159197 A1    Jul. 12, 2007

(51) Int. Cl.
*G01R 31/02* (2006.01)
*H05K 3/02* (2006.01)

(52) U.S. Cl. .................................... 324/755
(58) Field of Classification Search .................. None
See application file for complete search history.

(56) References Cited

U.S. PATENT DOCUMENTS

| | | | |
|---|---|---|---|
| 4,151,465 A | | 4/1979 | Lenz |
| 4,517,512 A | | 5/1985 | Petrich et al. |
| 4,525,802 A | | 6/1985 | Hackamack |
| 4,767,983 A | | 8/1988 | Pfaff |
| 4,829,241 A | | 5/1989 | Maelzer |
| 4,985,893 A | | 1/1991 | Gierke |
| 5,001,422 A | | 3/1991 | Dahlberg et al. |
| 5,541,525 A | * | 7/1996 | Wood et al. ............... 324/755 |
| 5,986,447 A | | 11/1999 | Hanners et al. |
| 6,025,732 A | * | 2/2000 | Foo et al. ................. 324/760 |
| 6,040,691 A | | 3/2000 | Hanners et al. |
| 6,359,452 B1 | | 3/2002 | Mozzetta |
| 6,509,752 B1 | | 1/2003 | O'Keeffe et al. |
| 2002/0101255 A1 | | 8/2002 | Nelson et al. |
| 2002/0105352 A1 | | 8/2002 | Mori et al. |

FOREIGN PATENT DOCUMENTS

| | | |
|---|---|---|
| EP | 1271163 A1 | 6/2001 |
| JP | 10221404 A | 8/1998 |

\* cited by examiner

*Primary Examiner*—Ha Tran Nguyen
*Assistant Examiner*—Trung Q. Nguyen
(74) *Attorney, Agent, or Firm*—Barnes & Thornburg LLP

(57) ABSTRACT

A testing apparatus is described with a housing, a power source, a carrier assembly, and a backbone connecting the carrier assembly to the power source. A resource board is disposed on the carrier assembly and is connected thereto, thereby receiving power from the power source through the carrier assembly. The resource board is adapted to perform a test on a device under test and to generate data reflecting results of the test on the device under test. A test pin assembly is disposed at one end of the resource board and is connectable with a loadboard. A controller operatively connects to the power supply, the carrier assembly, and the resource board. The controller is adapted to communicate with the resource board to execute instructions to test the device under test. The controller also receives the result data from the resource board, permitting analysis of the device under test.

31 Claims, 32 Drawing Sheets

APPARATUS, METHOD AND SYSTEM FOR TESTING ELECTRONIC COMPONENTS

CROSS-REFERENCE

The present application is a first-filed patent application for the subject matter described herein. Accordingly, this application does not rely on any other application for priority.

FIELD OF THE INVENTION

The present invention relates to an apparatus used for testing a broad spectrum of electronic and electrical components and combinations of components. The present invention also relates to a method for testing a wide array of different electronic and electrical components and combinations of components. In addition, the present invention relates to a system that is used to test electronic and electronic components.

BACKGROUND OF THE INVENTION

The prior art is replete with various different types of equipment designed to test the operability and functionality of electronic and electrical components and combinations of components.

Several difficulties are known to exist with respect to prior art testing apparatuses, methods, and systems.

Testing devices are employed for many different reasons. Among them, testing devices are used to validate the acceptability of electronic or electrical devices during the manufacture of those electrical or electronic components or the commercial products in which these components are incorporated.

In one example, it is known to test semiconductor chips before they are incorporated into other devices, such as computers. The acceptability of these semiconductor components may require several different tests, arranged in a test sequence, to be performed on the semiconductor components.

One deficiency associated with the prior art lies in the design and construction of known testing devices. Specifically, to test a particular component, a manufacturer is required to build (or contract with a third party to have built) a testing device for the component to be tested.

To test a variety of components, the testing device typically is over-designed, which means that the testing device includes components and hardware that are not used during every test sequence. As a result, in many cases, at least a portion of the testing device remains idle. In a worst-case scenario, the entire testing device remains idle, and the manufacturer must employ an entirely different testing device. In such a case, a manufacturer may be required to purchase a number of different testing devices to meet different testing demands during the year. Each testing device can be quite costly to the manufacturer.

As should be appreciated by those skilled in the art, few manufacturers make only one electronic component during the course of a manufacturing year. In fact, it is quite common for a manufacturer to make several different electronic components during the course of a year.

Each time the manufacturer switches to the manufacture of a different component, the manufacturer utilizes different parts of the testing device for that component. It is also possible that the manufacturer may need to add or exchange parts of the testing device when testing a different component. Alternatively still, a manufacturer may need to switch to another testing device altogether.

As a result of this, manufacturers often find that at least a portion of the testing device remains idle for long periods of time. In other cases, the entire testing device may remain idle. In either case, electronic manufacturers spend large sums of money on testing devices, parts of which are used only for short periods of time, parts of which are used only periodically, or parts of which are used only for a particular production run. The cost of these testing devices is passed onto the consumer and is reflected in the cost of the electronics that are sold.

As a result of this approach to testing, there has developed a need for a greater amount of granularity in the design of testing devices. In other words, a need has developed for testing devices where portions of the testing device may be substituted to adapt the testing device for different components, so that the testing device is more easily configured for a particular component under test. In addition, a need has developed for less expensive testing devices. These needs remain unaddressed by the prior art.

Another difficulty with the prior art lies in the length of time needed to test an individual electronic or electrical component.

Currently, testers rely on a non-pipelined approach to testing. What this means is that current testing devices do not apply a testing methodology where the handling of the component to be tested and the gathering of data are handled separately from the processing of the gathered data as a result of the testing of the component. In the prior art methodology, gathering data, processing data, and handling occur consecutively for each tested component or groups of tested components.

After the test is complete, the testing device analyzes the results of the test and generates an evaluation report for that component or group of components.

In the simplest example, after the test sequence is completed, the testing device will assess the operability of the component and assign a "pass" or "fail" result to the component. The analysis is performed while the component is connected to the testing device so that prompt action may be taken with respect to that component at the conclusion of the test sequence. As would be appreciated by those skilled in the art, a component that "passes" will be sold to the consumer or will proceed to the next manufacturing step. If the component "fails" the test, the component will be discarded or returned for further processing, as needed.

This non-pipelined approach to testing presents a number of issues. Among them, the total test time needed to test components and return a report may negatively impact the manufacturing process, because the length of the test sequence may occupy a significant part of the manufacturing process.

Among others, the deficiencies noted above with respect to the prior art remain unresolved.

SUMMARY OF THE INVENTION

It is therefore, one aspect of the present invention to resolve one or more of the difficulties enumerated above with respect to the prior art.

One aspect of the present invention is to provide a testing apparatus that may be adapted easily to test more than one electronic component.

In this regard, the present invention provides a granular (or modular) approach to the construction of a testing apparatus, permitting the testing apparatus to be configured for testing a particular component and variations thereof. The present invention may be modified on a more granular level than prior art testing devices so that the testing apparatus may be more easily adapted to different components to be tested.

One further aspect of the present invention is to granularize the circuit boards relied upon for testing, so that the circuit boards may be readily reconfigured to construct testing apparatuses that are inexpensive relative to prior art testing devices.

One additional aspect of the present invention is to design a testing apparatus with testing boards where portions may be removed and replaced to accommodate changes in manufacturing of electrical and electronic components.

A further aspect of the present invention is to provide a method for testing electronic or electrical components where the total time for the test sequence is shorter than prior art testing sequences.

One additional aspect of the present invention is to provide a method for testing electronic or electrical components where the testing steps may be performed in a pipelined relationship to other testing steps, thereby reducing the total time required to test a number of electronic or electrical components.

With respect to this aspect of the present invention, the term "pipelining" is meant to refer to a testing sequence where individual tests or groups of tests that make up the test sequence may be performed in parallel with one another. With some of the tests or portions of tests being performed in parallel, it is an aspect of the present invention to reduce the total time for a test sequence associated with the testing of a particular component.

Accordingly, one aspect of the present invention provides a testing apparatus that includes a housing, a power source, a carrier assembly disposed within the housing, a backbone distributing power from the power source to the carrier assembly and distributing a clock signal to the carrier assembly, a resource board disposed on the carrier assembly and connected thereto via a carrier board connection, wherein the resource board is adapted to perform at least a portion of a test by at least one of supplying signals to and receiving signals from a device under test, thereby generating test results, a test pin assembly operatively connecting the resource board to a loadboard, which is connectable to the device under test, and a controller in communication with the resource board, wherein controller is adapted to execute instructions to test the device under test and to return an analysis of the device under test using the test results.

Another aspect of the present invention is to provide a testing apparatus where the controller executes instructions to the test the device under test and return an analysis of the device under test using the test results without reliance on synchronization hardware.

Still another aspect of the present invention provides a testing apparatus where a test pin assembly is disposed at one end of a resource board.

An additional aspect of the present invention is to provide a testing apparatus where several carrier assemblies are disposed within the housing in a side-by-side arrangement.

Yet another aspect of the present invention is to provide a testing apparatus where several resource boards are disposed on each carrier assembly.

One further aspect of the present invention is to provide a testing apparatus where up to eight resource boards are connected to the carrier assembly.

With respect to the test pins, it is one aspect of the present invention to provide a testing apparatus where the test pins are connectable to the loadboard.

It is another aspect of the present invention to provide test pin assemblies where eight test pins are provided for each test pin assembly. The test pins may be arranged in any number of configurations.

One further aspect of the present invention is to provide a construction for the carrier assembly where an air gap is defined between first and second sides, permitting cooling via the gap.

Another aspect of the present invention is to provide a clamping mechanism for releasably connecting the loadboard to the test pins.

Concerning the clamping mechanism, it is an aspect of the present invention to provide a clamping mechanism that includes a camshaft disposed between the first and second sides of the carrier assembly, the camshaft defining a cam therealong, wherein an axis of the cam is offset radially from an axis of the camshaft, a T-shaped pin disposed substantially orthogonally to the cam, wherein a top end of the T-shaped pin presents a T-shaped cross-section and is protrudable from a top surface of the clamping mechanism and wherein a bottom end of the T-shaped pin abuts against the cam, a spring disposed between the clamping mechanism and the bottom end of the T-shaped pin, wherein the spring biases the T-shaped pin such that the bottom end of the T-shaped pin is biased against the cam, and a knob defined by an end of the camshaft, wherein, when the knob is rotated, the camshaft rotates, causing the top end of the T-shaped pin to extend from the top surface of the clamping mechanism and to retract toward the top surface of the clamping mechanism.

With respect to the clamping mechanism, it is an aspect of the invention to provide several cams disposed on the camshaft, several T-shaped pins abutted against the cams, and several springs disposed between the clamping mechanism and the bottom ends of the T-shaped pins. When the knob is rotated, the T-shaped pins move in unison with the cams.

Still another aspect of the present invention provides a testing apparatus where the loadboard defines an eyelet hole that releasably engages the top end of the T-shaped pin so that, when the T-shaped pin retracts toward the top surface of the clamping mechanism, the top end of the T-shaped pin draws the loadboard onto the test pins.

It is yet another aspect of the present invention to provide a pipelined testing method for a device under test that includes, in a first test path, setting up a first test of a first device under test, conducting the first test of the first device under test, generating data about the first device under test as a result of conducting the first test. In a second test path, the method includes moving the data from the first test to a data processor, processing the data from the first test, and returning first results of the processing. The first and second test paths are performed in parallel with one another.

An additional aspect of the present invention provides a testing method where the results of the second test path include a conclusion concerning the acceptability of the first device under test.

It is another aspect of the present invention to provide a testing method that includes datalogging of the first results, wherein the first results are datalogged with substantially no impact to an overall test time.

One further aspect of the present invention provides for a testing method that includes gathering test data about a first device under test during a first data gather time period, processing data about the first device under test during a first data processing time period, handling the first device under test during a first handler index time period, gathering test data about a second device under test during a second data gather time period, processing data about the second device under test during a second data processing time period, and handling the second device under test during a second handler index time period, where the first data processing time period overlaps at least the first handler index time period.

In this regard, another aspect of the present invention is to provide a testing method including gathering test data about an $n^{th}$ device under test during an $n^{th}$ data gather time period, processing data about the $n^{th}$ device under test during an $n^{th}$ data processing time period, handling the $n^{th}$ device under test during an $n^{th}$ handler index time period, gathering test data about an $(n+1)^{th}$ device under test during an $(n+1)^{th}$ data gather time period, processing data about the $(n+1)^{th}$ device under test during an $(n+1)^{th}$ data processing time period, handling the $(n+1)^{th}$ device under test during an $(n+1)^{th}$ handler index time period, where the $n^{th}$ data processing time period overlaps at least the $n^{th}$ handler index time period.

Other aspects of the present invention will be made apparent from the discussion that follows.

BRIEF DESCRIPTION OF THE DRAWINGS

The drawings appended hereto are intended to provide specific examples of the present invention and are not intended to be limiting thereof. To the contrary, the examples illustrated are intended to convey to those skilled in the art the expansive potential of the apparatus, system, and method of the present invention. In the drawings, therefore.

Figure 1:
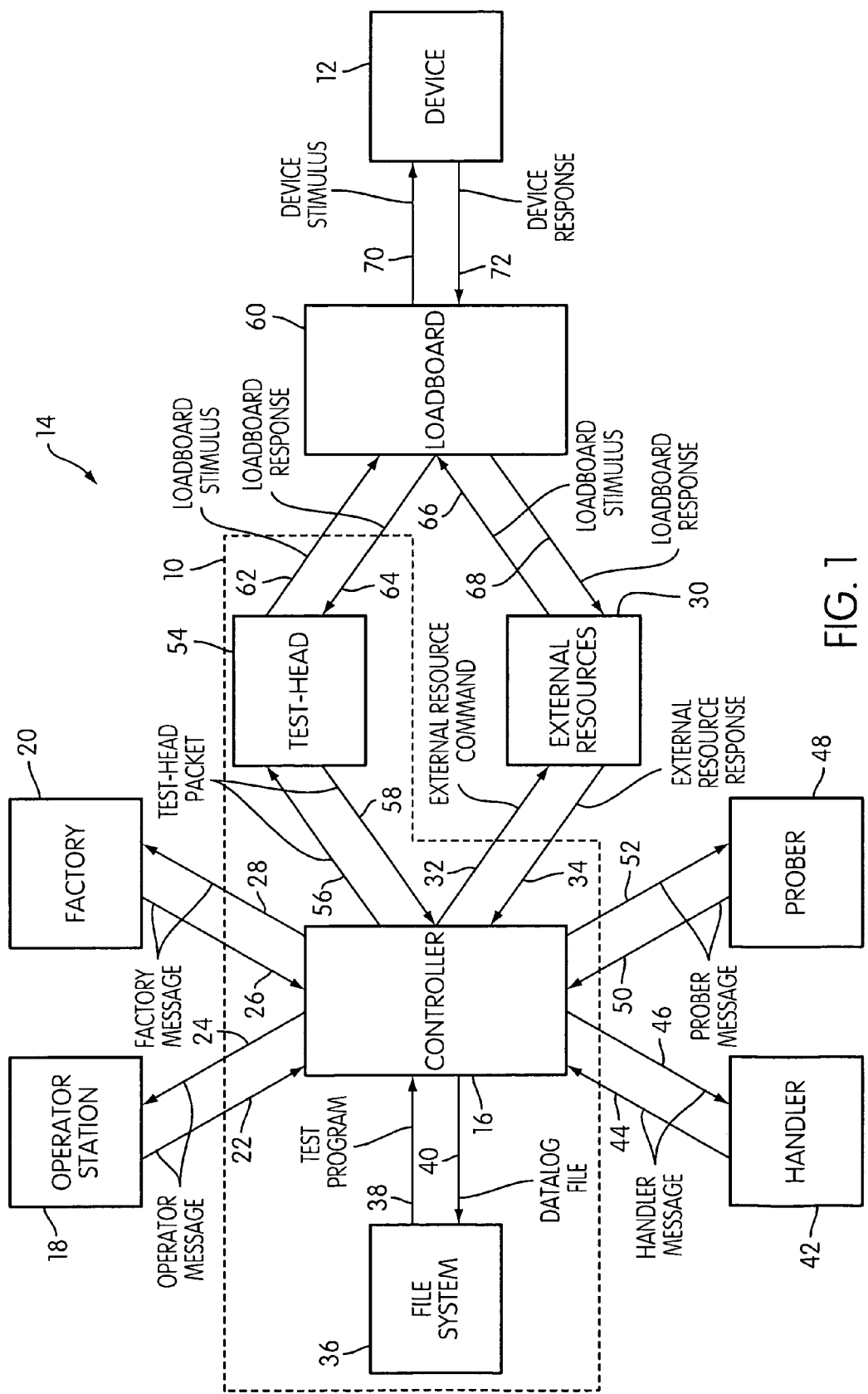
FIG. 1 is an architectural overview of the testing system of the present invention.

DESCRIPTION OF THE PREFERRED
EMBODIMENTS OF THE INVENTION

While specific embodiments of the present invention are discussed herein and are illustrated in the drawings appended hereto, the present invention encompasses a broader spectrum than the subject matter described and illustrated. As would be appreciated by those skilled in the art, the embodiments described are but a few examples of the broad scope of the present invention. There is no intention to limit the scope of the invention only to the embodiments described.

Within this description, the terms electronic component and electrical component are intended to refer to any component or device that operates using electricity. Moreover, the term component is meant to encompass any device that is a single component device or a device that combines a number of components together. In other words, it is intended that the terms be defined as broadly as would be understood by those skilled in the art. The use of the term "electronic" or "electrical" is not intended to be limiting in any manner, unless so specified herein. Before delving into the specifics of the present invention, a general overview is provided below.

The testing apparatus 10 of the present invention is a general-purpose testing apparatus that is designed to test semiconductor components, among other electronic components and devices. As would be appreciated by those skilled in the art, the testing apparatus 10 of the present invention is not limited to the testing of semiconductor components. Instead, the testing apparatus 10 may be employed to test a wide variety of devices and components. For example, the testing apparatus 10 may test mixed-signal, digital, analog, CMOS ("Complementary Metal Oxide Semiconductor") Image Sensor ("CIS"), and radio frequency ("RF") signals, to list but a few of the different types of signals contemplated for testing by the testing apparatus 10. As should be understood by those skilled in the art, the testing apparatus 10 may be scaled to address the full range of semiconductor technologies in the industry.

It is contemplated that the testing apparatus 10 may employ any number of different signals to test the device under test ("DUT") 12. For example, the testing apparatus 10 may rely solely on electrical signals. Alternatively, the testing apparatus 10 may employ physical sensors that collect information about the physical structure of the DUT 12 or structures, such as electrical leads, connected to the DUT 12. Alternatively still, the testing apparatus 10 may rely on optical data about the DUT 12 for one or more of the tests performed on the DUT 12. Further, the testing apparatus 10 may assess the emission quality of a particular DUT 12, such as the strength of an electromagnetic signal generated thereby. As would be appreciated by those skilled in the art, the testing apparatus 10 is not limited solely to the listed signals but may employ any type of electrical, physical, or electromagnetic information (to list a few examples) generated in connection with the DUT 12.

In one contemplated embodiment, the testing apparatus 10 is a full feature, highly-configurable, mixed-signal test solution for the electronic semiconductor market. The testing apparatus 10 is designed to provide the lowest cost of testing for a wide range of devices produced each year, including a wide variety of semiconductor components. The ability to scale and customize the testing apparatus 10 enables customers to obtain the maximum value for their applications while providing the ability to efficiently upgrade the testing apparatus 10 to create the configurations that support future changes in business and technologies that have yet to be created.

The architectural design of the testing apparatus 10 permits new and unique capabilities to be brought to the semiconductor test market. The integration of mechanical, electrical and software concepts, all of which are part of the present invention, significantly reduces testing time, simplifies test program development, reduces the cost of the hardware for the testing apparatus 10, enables the user to easily customize and configure the testing apparatus 10, minimizes the size, footprint and interconnection complexity associated with the testing apparatus 10, and allows for an easy upgrade path to handle future testing challenges with respect to technology to be developed.

FIG. 1 presents a high-level, architectural block diagram of one embodiment of the testing system 14 of the present invention. The testing apparatus 10 is designed to provide an easy-to-use interface to the external environment (people, computers, equipment and the DUT 12, among others). As would be appreciated by those skilled in the art, this illustration provides a general representation of one embodiment of the testing apparatus 10 and the testing system 14 of the present invention. This illustration should not be understood to imply that each of the interfaces shown are required for the function of the testing apparatus 10 and testing system 14 of the present invention. Other configurations are possible and are intended to fall within the scope of the present invention.

As may be appreciated from FIG. 1, a controller 16 provides control function, at least in part, over the testing apparatus 10. It is possible that the controller 16 may provide only part of the control function as other aspects of control functionality may be provided from external sources, such as an operator station 18 (permitting input by an operator), a factory 20, or another external resource 30, among others. In addition, it is contemplated that some of the control function may be provided by components of the testing system 14 that are internal to the testing apparatus 10.

The controller 16 preferably utilizes software that runs on one or more central processing units (or "CPUs") that make up the controller 16. Alternatively, the controller 16 need not be a stand alone device. Instead, as would be appreciated by those skilled in the art, the controller 16 may comprise several independent CPUs that are networked together and coordinate with one another. If the controller 16 encompasses a network of CPUs, the different processors need not be located physically together in the same geographic region. The different processors may be connected via wired connections, such as telephone lines or the Internet, or connected via wireless communication channels.

The software run on the controller 16 preferably is customizable via a test program written for a particular test application. The test application refers to the particular DUT 12 to be tested. As would be appreciated by those skilled in the art, a testing sequence for a single DUT 12 may involve several different tests. In a complex case, one thousand or more individual tests may be performed on a particular DUT 12. The exact sequence and number of tests are determined by the manufacturing needs associated with the DUT 12.

In the configuration illustrated in FIG. 1, the controller 16 connects to the operator station 18, to the factory 20, and to the external resource 30 via two-way communications links 22, 24, 26, 28, 32, 34. The communications links 22, 24, 26, 28, 32, 34 permit the controller 16 to send information to the operator station 18, the factory 20, and the external resource 30. As illustrated, the controller 16 also may receive information from the operator station 18, the factory 20, and the external resource 30. The external resources 30 are contemplated to include test equipment that is controlled via custom or standard computer protocols.

As should be appreciated by those skilled in the art, the controller 16 preferably is a CPU or cooperating number of CPUs capable of executing software commands. The controller 16 may be a computer or any other type of data processor. For example, the controller 16 may be a handheld device such as a personal data assistant (or "PDA"). The wide variety of different types of controllers 16 that may be employed by the testing apparatus 10 would be understood by those skilled in the art and are, therefore, not expounded upon further.

In FIG. 1, communications links 22, 24, 26, 28, 32, 34 are illustrated as separate communications links. While illustrated in this manner, it should be understood that the communications links 22, 24, 26, 28, 32, 34 may be individual links that provide only for one-way communication. Alternatively, the links may be single communication channels that permit two-way communication thereacross. For purposes of the present invention, it should be understood that any communication link may be either a one-way or a two-way (or other type of multi-directional) link, unless otherwise noted. Moreover, the communication link 22, 24, 26, 28, 32, 34 may be a wired link, a wireless link, or an optical link, as would be appreciated by those skilled in the art. In addition, it is not intended for the communication links 22, 24, 26, 28, 32, 34 to be the only links available in the testing apparatus 10. It is contemplated that other communication links between the various illustrated components may be required by the particular configuration of the testing apparatus 10 or the testing system 14 designed for a particular testing environment. For example, it is contemplated that one or more communication links (not shown) may be established between the operator station 18 and the factory 20.

In the embodiment illustrated in FIG. 1, the testing apparatus 10 includes a file system 36 connected via communication links 38, 40 to the controller 16. The file system 36 preferably is a data storage device incorporated into the testing apparatus 10. The file system 36 may be any suitable type of data storage device including, but not limited to, a magnetic memory device such as a hard disk drive, a removable magnetic disk drive, an optical disk drive (such as a compact disk drive), or an electronic storage device that stores information on an electronic card or the like. The file system 36 should not be understood to be limited to any particular data storage device and is intended to encompass any data storage device on which data may be stored or from which data may be retrieved. In the embodiment illustrated, it should be understood that the file system 36 is a magnetic storage device such as a hard disk drive.

As illustrated, the communication links 38, 40 connect to the controller 16 so that data may be transferred between the file system 36 and the controller 16. For example, the communication link 38 permits programs, such as test programs, to be transmitted from the file system 36 to the controller 16 for execution by the controller 16. Data files, such as datalog files, may be transmitted from the controller 16 to the file system 36 for storage by the file system 36 via the communication link 40. Other types of data also may be transmitted across the communications links 38, 40, as would be appreciated by those skilled in the art and are, therefore, not limited solely to the types of files enumerated by FIG. 1.

While the file system 36 preferably forms a part of the testing apparatus 10, the file system 36 does not need to be physically connected to the controller 16. As indicated above, the controller 16 may be a group of CPUs that are networked together to provide the functionality required to test the DUT 12. In such an example, the file system 36 may comprise one or more file systems that are networked together and communicate with the controller and other components of the testing system 14.

As illustrated, the testing apparatus 10 preferably is connected to a handler 42 by communication links 44, 46. The handler 42 may be any type of device suitable for handling the different types of DUTs 12 that may be tested by the testing apparatus 10. The handler 42 places the DUT 12 into contact with the testing apparatus 10. Handler messages, including handler instructions and data, are passed through the communications links 44, 46 between the handler 42 and the controller 16. The handler 42 preferably is a peripheral device connected to the controller 16 via the communications links 44, 46. For example, the handler 42 may be a Multitest 9918, which is the name and model number of a handler made by Multitest Electronische Systeme GmbH of Rosenheim, Germany. As would be understood by those skilled in the art, the handler 42 need not be a device separate from the testing apparatus 10. Instead, the handler 42 may be included as a part or the testing apparatus 10 without departing from the scope of the present invention.

In the embodiment illustrated, a prober 48 also is connected to the testing apparatus 10 via communication links 50, 52. The prober 48 assists with testing one or more physical connections to the DUT 12. The prober 48 may, for example, facilitate testing of the reliability of leads connected to the DUT 12. The prober 48 may be of any suitable type depending on the testing required or depending upon the testing environment. Prober messages, instructions, and data may be sent along the communication links 50, 52. The prober 48 preferably is a device peripherally connected to the testing apparatus 10. For example, the prober 48 may be an Electroglas 4090, which is the name and model of a prober made by Electroglas, Inc. of San Jose, Calif., USA. As would be understood by those skilled in the art, the prober 48 need not be a device separate from the testing apparatus 10. Instead, the prober 48 may be included as a part or the testing apparatus 10 without departing from the scope of the present invention.

In addition, the testing apparatus 10 includes a test head 54 connected to the controller 16 via communication links 56, 58. As would be appreciated by those skilled in the art, the file system 36 and the test head 54 need not be incorporated as parts of the testing apparatus 10. As with the handler 42 and the prober 48, one or both of the file system 36 and the test head 54 may be external components to the testing apparatus 10 without departing from the scope of the present invention.

The test head 54 preferably is a part of the testing apparatus 10. As illustrated in FIG. 1, the test head 54 is connected to the controller 16 via communication links 56, 58. The test head 54 interfaces with the DUT 12, usually through a loadboard 60. As depicted in FIG. 1, the loadboard 60 preferably is connected to the test head 54 via communication links 62, 64. Also as illustrated, the loadboard 60 preferably is connected to the external resources 30 via communications links 66, 68.

The test head 54 preferably contains both hardware and software for testing DUTs 12. With respect to software, the test head 54 preferably contains or is capable of executing one or more test programs that specify the test head resources needed for testing a particular type of DUT 12. The interface between the controller 16 and test head 54 includes multiple communication links, of which communication links 56, 58 are illustrated. Multiple connections to the test head 54 are useful for multi-site DUT applications that generate large amounts of data. Moreover, it is useful to employ multiple computers to process the data, as would be appreciated by those skilled in the art.

The loadboard 60 is a custom interface that is designed by the user to connect the tester resources to one or more DUTs 12. Each loadboard 60 is configured to connect the terminals of the DUT 12 to the test head 54. In many instances, the loadboard 60 will be used to test one particular type of DUT 12. Of course, as would be appreciated by those skilled in the art, it is possible that different types of DUTs 12 may rely on the same loadboard 60 design for connection to the test head 54.

Figure 2:
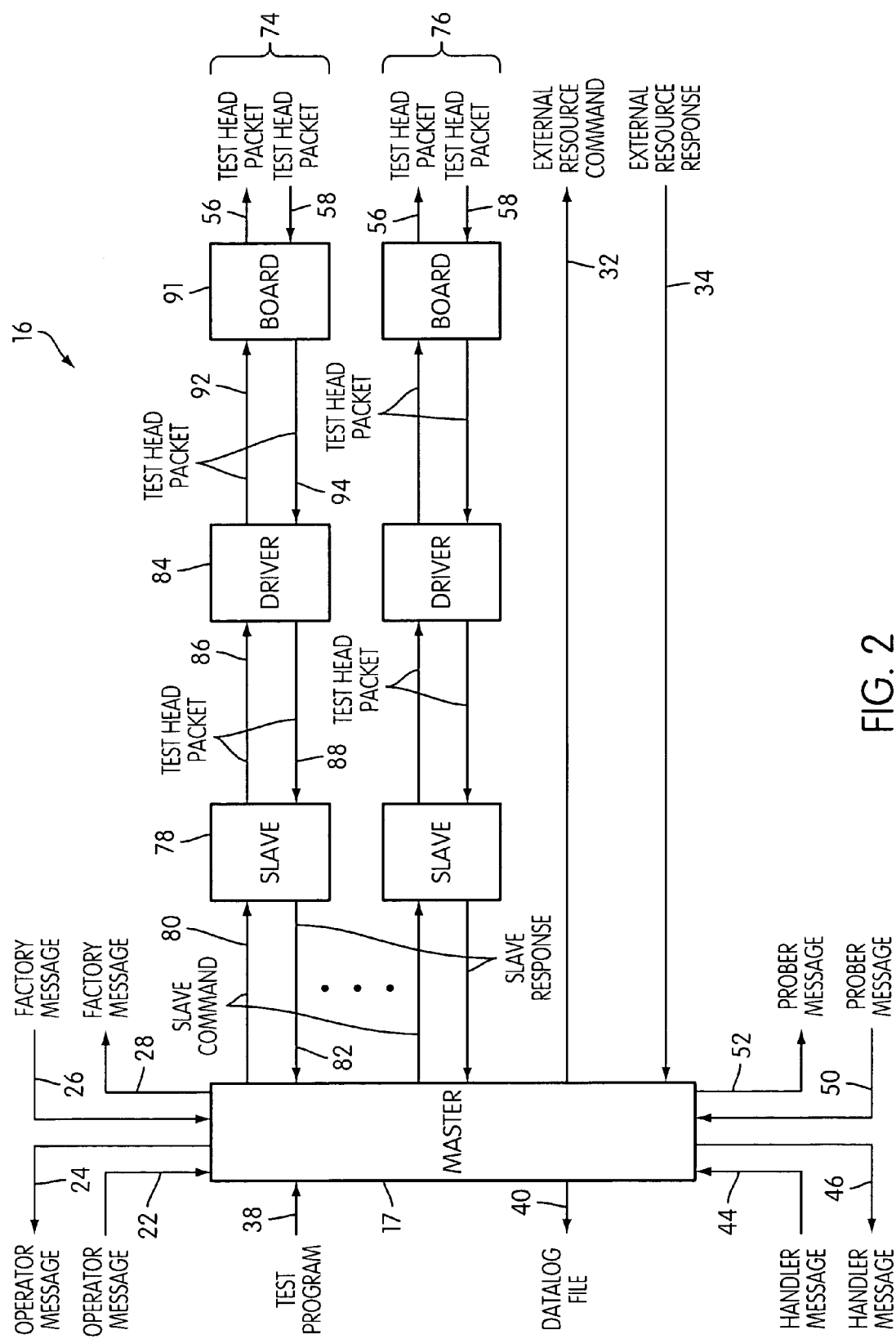
FIG. 2 is an architectural diagram of portions of the controller of the testing system illustrated in FIG. 1, showing various interconnections of sub-elements thereof.
Figure 3:
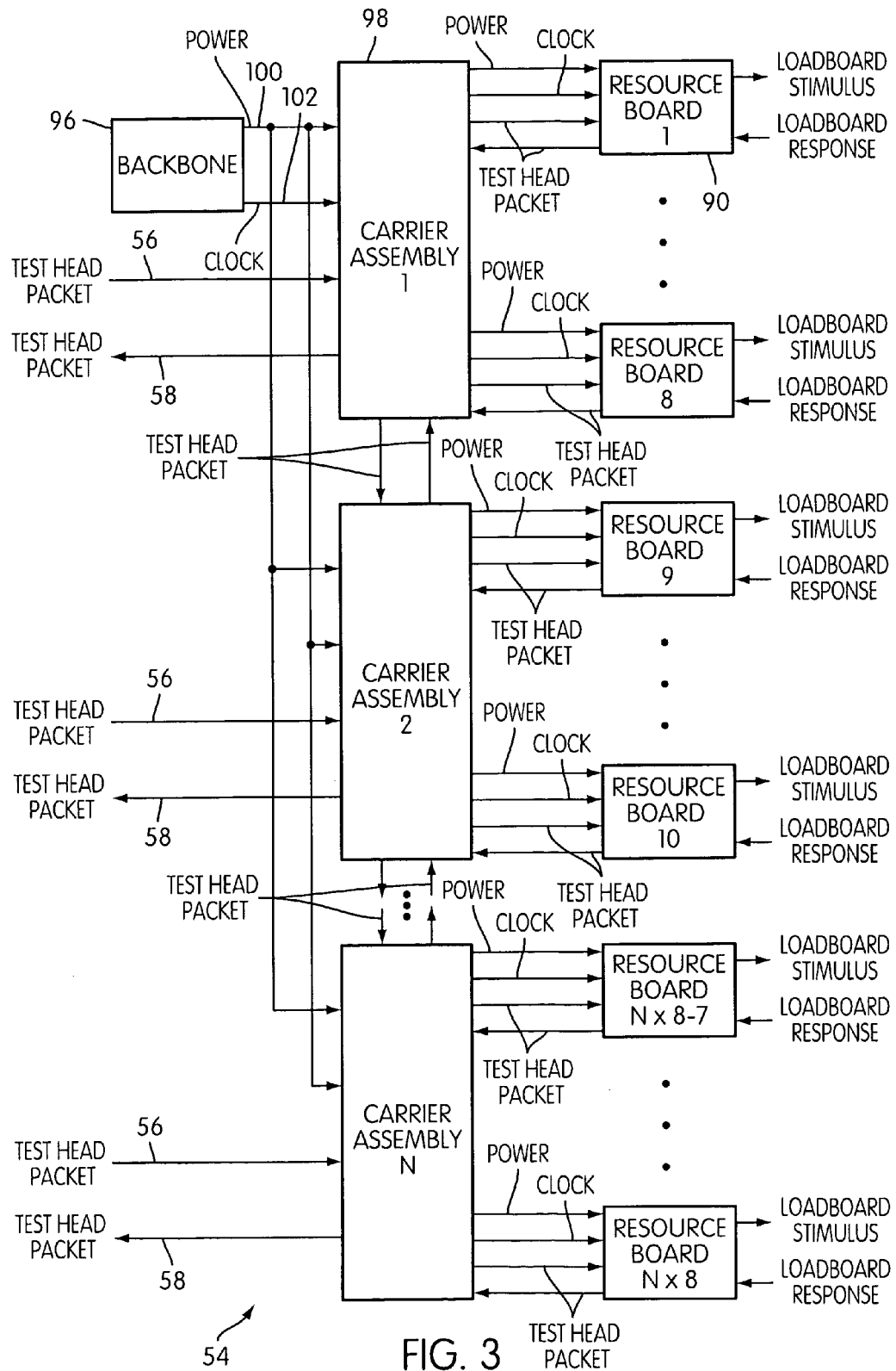
FIG. 3 is an architectural diagram of a test head of the present invention, illustrating interconnections between various elements of the test head.

FIGS. 2 and 3 are architectural diagrams that facilitate an understanding of the operation of the testing apparatus 10. In particular, FIGS. 2 and 3 illustrate one way in which the testing apparatus 10 and the test head 54 cooperate to enable the hardware and software to form the foundation for the deterministic testing platform of the present invention. "Deterministic testing platform" is intended to refer to, among other things, the aspect of the present invention that supports a testing sequence for pipelined processing, as discussed more fully herein.

FIGS. 2 and 3, which will be described in greater detail below, illustrate one contemplated embodiment of the present invention which utilizes multiprocessing technologies to facilitate the pipelining of data.

FIG. 2 illustrates a portion of the testing apparatus 10 of the present invention. In particular, FIG. 2 illustrates components that make up the controller 16 illustrated in FIG. 1. The master 17, which may be a processor that executes software instructions, is connected to the test head 54 via one or more communication pathways. Two tester pathways are illustrated in FIG. 2, a first tester pathway 74 and a second tester pathway 76. The components that comprise both of the tester pathways 74, 76 preferably are located within the controller 16. As would be appreciated by those skilled in the art, however, this is not required to practice the present invention.

While two tester pathways 74, 76 are illustrated in FIG. 2, any number of tester pathways may be incorporated into the controller 16 without departing from the present invention. In fact, it is contemplated that the controller 16 will encompass a plurality of tester pathways, especially in complex testing environments.

As shown in the first tester pathway 74, the master 17 communicates with a slave 78 via two communication links 80, 82. The slave 78 is a server that bundles instructions and information to and from the master 17 so that the information may be analyzed and stored, for example. In the preferred embodiment, there is no operator graphical user interface ("GUI") for the software running on each slave 78.

The slave 78 is connected to a driver 84 via two communication links 86, 88. The driver 84 is a software program resident in the controller 16 that is used by the slave 78 to communicate with the test head 54 using a packet switching communication protocol over a high-speed serial interface, for example. The driver 84, therefore, operates via one or more protocols that are a subset of the program protocols resident in the controller 16. While this is the preferred embodiment, it is possible that the driver 84 may include one or more processors disposed in a location separate from the controller 16, as would be appreciated by those skilled in the art.

The driver 84 also is connected to printed circuit board 91 via communication links 92, 94. The printed circuit board 91 is connected to the test head 54 via communication links 56, 58. As FIG. 2 illustrates, there may be one or more tester pathways 74, 76, each of which includes a slave 78, a driver 84, and a printed circuit board 91. In one example, the printed circuit board 91 may be a card such as a PCI ("Peripheral Component Interconnect") Express Board.

Returning to the controller 16, it is noted that the controller 16 executes the instructions provided by a master program. In one embodiment, the master program may be described as a server program that runs on the controller 16 to provide instructions to control the testing apparatus 10 and the testing system 14. As an alternative, it is also contemplated that multiple testing apparatuses 10 or multiple testing systems 14 may be connected to one another at the same time. In addition, it is also contemplated that one controller 16 may be relied upon to execute instructions for more than one testing apparatus 10 or system 14. In other words, one controller 16 need not be dedicated to only one apparatus 10 or one system 14.

FIG. 2 illustrates various components that are part of the controller 16. As illustrated, the controller 16 includes the master 17 that controls one or more slaves 78 simultaneously and also controls the external resources connected thereto. Each slave 78 processes data from the test head 54 and sends the results to the controller 16. Each connection from a test head 54 to the master 17 preferably includes a slave 78 to provide communication and interface functions.

FIG. 3 illustrates the interconnections between various components of the test head 54 of the present invention. As should be appreciated by those skilled in the art, and as illustrated by FIG. 3, the test head 54 encompasses a number of components. More specifically, it is noted that, with the exception of the loadboards, FIGS. 4-6 show various embodiments of the test head 54 of the present invention.

In the illustrated embodiment, the testing apparatus 10 includes a backbone 96 that communicates with one or more carrier assemblies 98 via power communication link 100 and a clock communications link 102. Power is provided via the power communication link 100, and a clock signal is provided via the clock communication link 102. Each carrier assembly 98 is connected to one or more resource boards 90. Each carrier assembly 98 also provides a heat sink, structural support and electrical connections to the resource boards 90.

The backbone 96 may be of any suitable construction contemplated by those skilled in the art. In one contemplated embodiment, the backbone 96 may be a daisy chain that connects the carrier assemblies 98 to one another. Since the backbone 96 connects several carrier assemblies 98 together, it is contemplated that the backbone 96 will run perpendicularly to the orientation of the carrier assemblies 98, but this is not required to practice the present invention, as would be appreciated by those skilled in the art.

Figure 4:
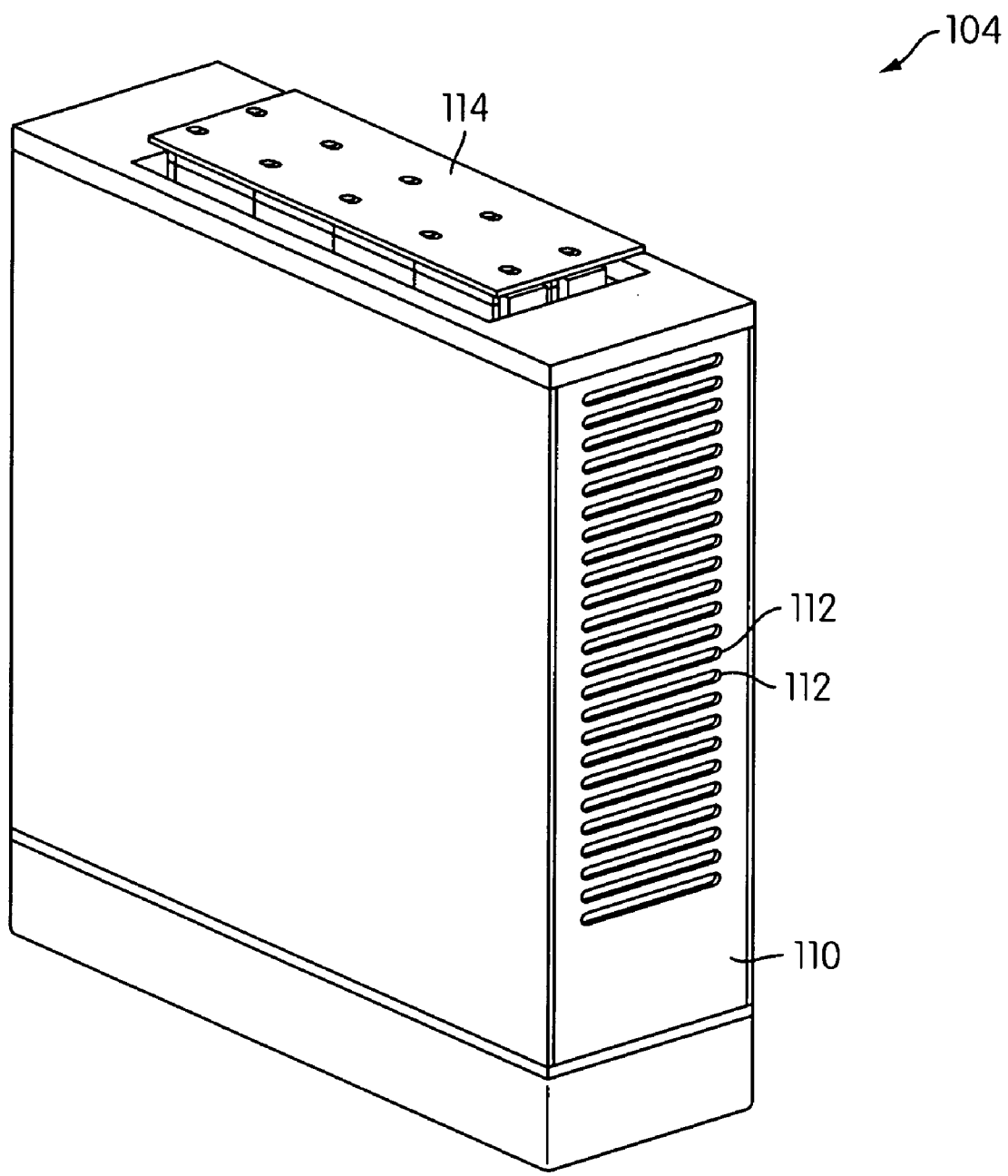
FIG. 4 is a perspective illustration of one contemplated configuration of the testing apparatus of the present invention, which is part of the testing system illustrated in FIG. 1.
Figure 5:
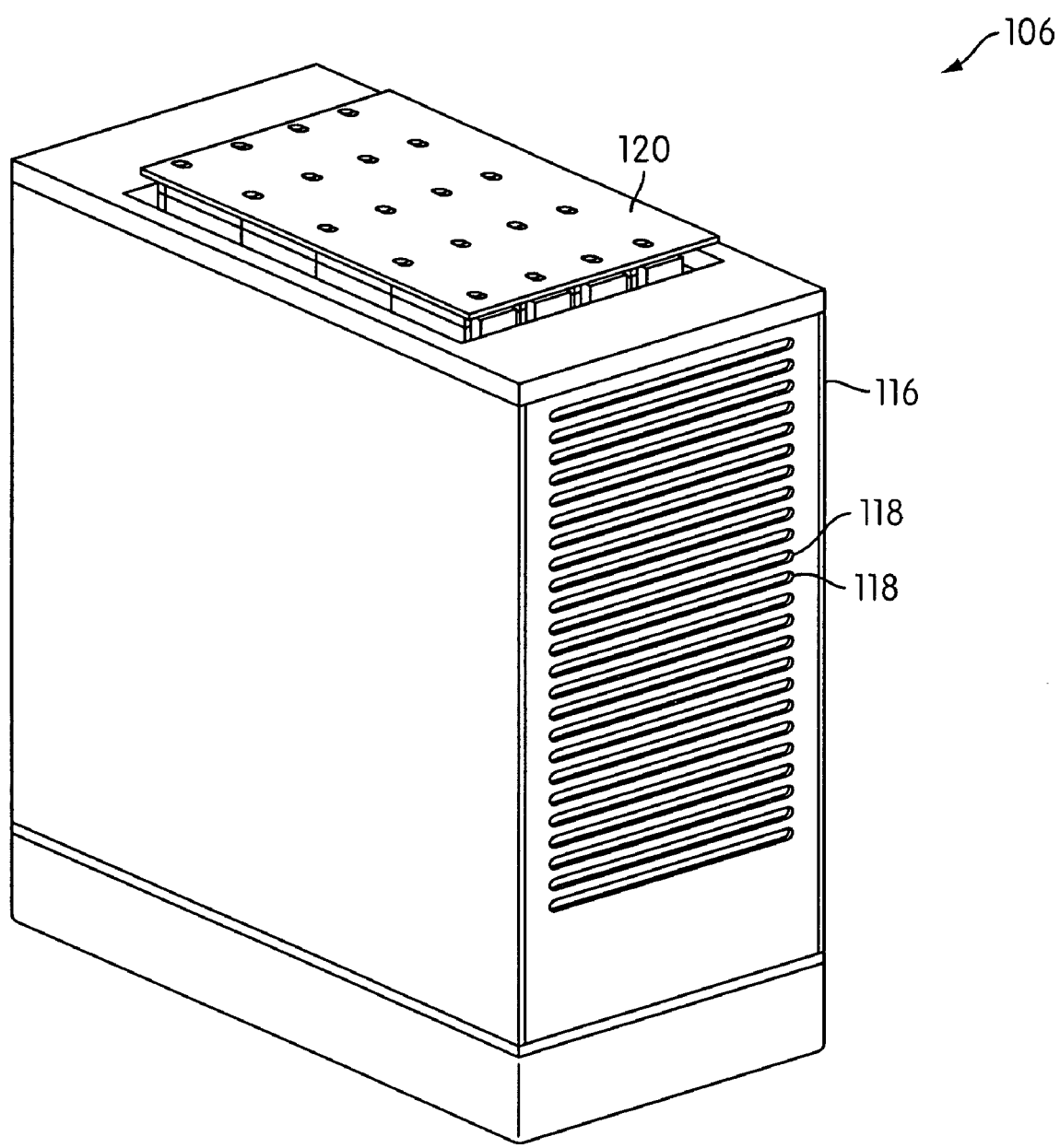
FIG. 5 is a perspective illustration of another contemplated configuration of the testing apparatus of the present invention.
Figure 6:
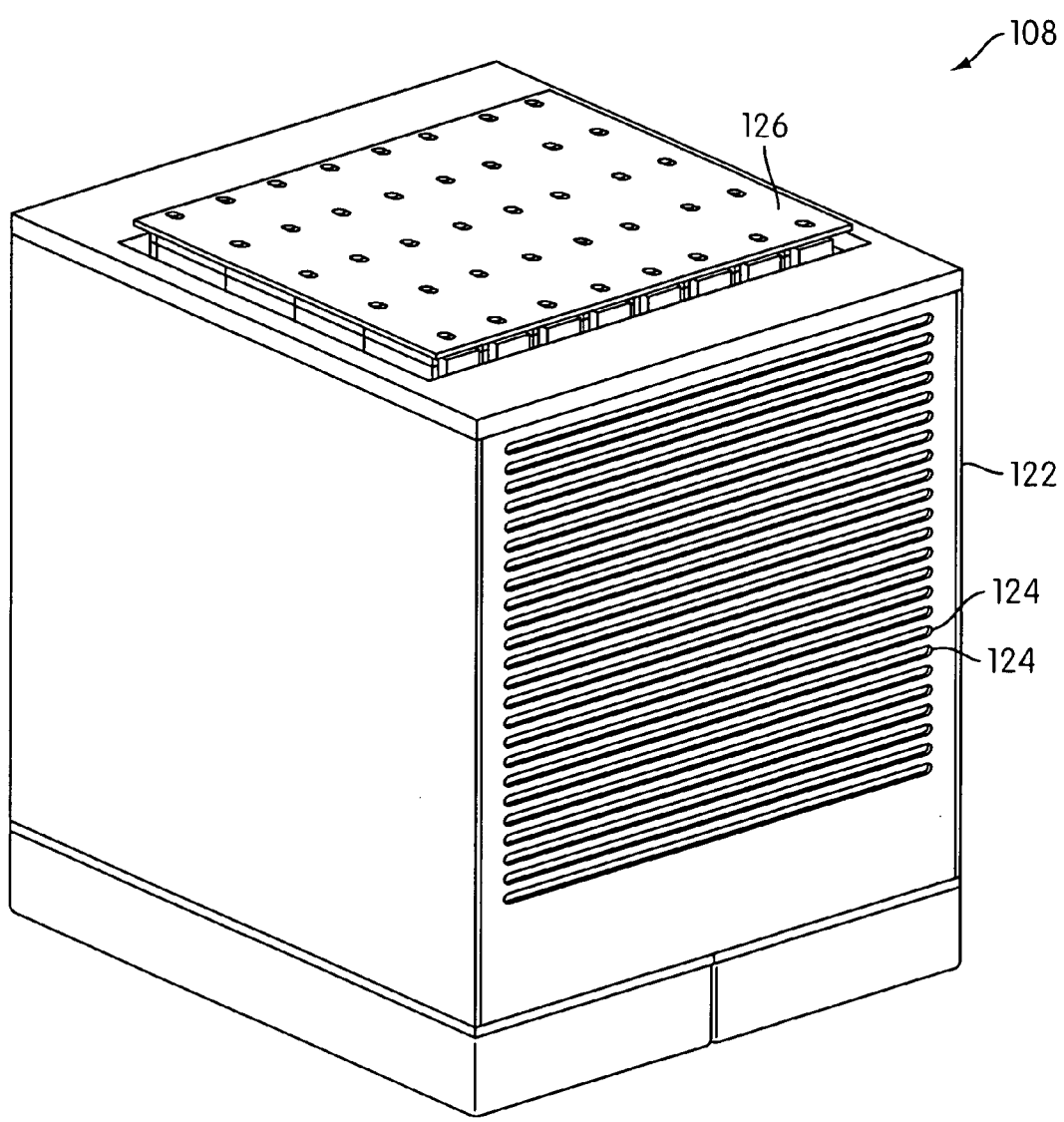
FIG. 6 is a perspective illustration of a third contemplated configuration of the testing apparatus of the present invention.

FIGS. 4, 5, and 6 illustrate three contemplated embodiments of the testing apparatus 10 of the present invention. As noted above, if the loadboards were excluded, the three embodiments also could be referred to as test heads. FIG. 4 illustrates a 2-slot, 128-pin test system configuration 104. FIG. 5 illustrates a 4-slot, 256-pin test system configuration 106. Finally, FIG. 6 illustrates an 8-slot, 512-pin test system configuration 108. The configuration 104 includes a housing 110 with ventilation openings 112. At the top of the housing 110, one embodiment of a loadboard 114 is connected to the housing 110. The configuration 106 is larger than the configuration 104. The configuration 106 is shown with a housing 116, ventilation opening 118, and a loadboard 120. The configuration 108 is larger still than the configuration 106. As illustrated, the configuration 108 has a housing 122 with ventilation opening 124 and a loadboard 126. As should be appreciated by those skilled in the art, the present invention may have any number of slots or pins and the configurations provided by FIGS. 4-6 are merely illustrative.

Figure 7:
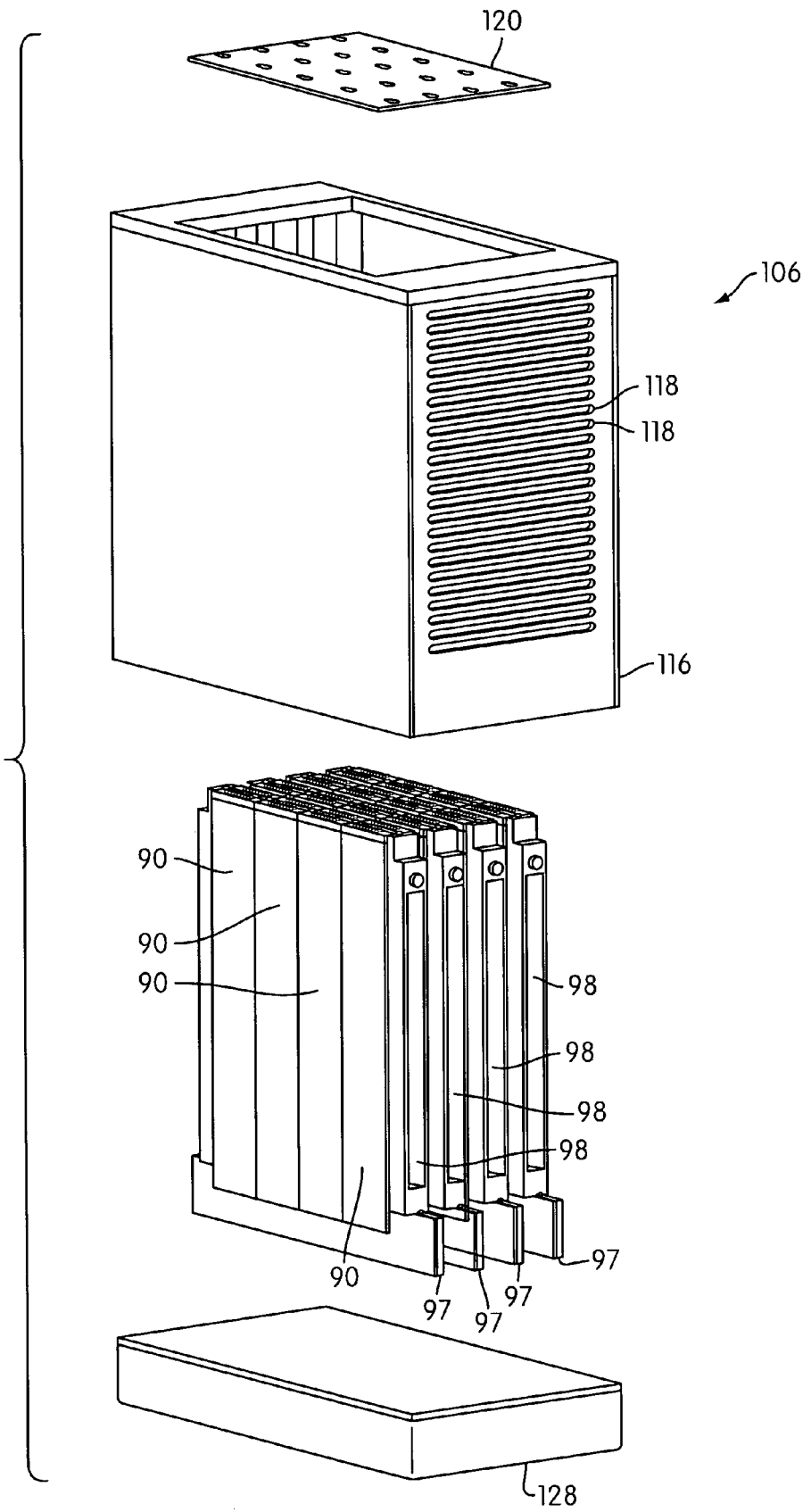
FIG. 7 is an exploded illustration of the contemplated configuration of the testing apparatus shown in FIG. 5.

FIG. 7 illustrates the configuration 106 in an exploded format for ease of understanding the testing apparatus 10 of the present invention. As illustrated, the housing 116 encompasses four separate carrier assemblies 98, each of which carry eight resource boards 90. The carrier boards 97 of each of the carrier assemblies 98 are easily seen in this view. The carrier boards 97 of the carrier assemblies 98 plug into the backbone 96, which is not illustrated. The backbone 96, in turn, connects the carrier assemblies 98 to the power supply 128, which is at the base of the configuration 106.

The power supply 128 is a common power supply from which each of the carrier assemblies 98 and each of the resource boards 90 draw power. The carrier boards 97 of the carrier assemblies 98 tap into the power supply 128 via the backbone 96. The carrier assemblies 98 distribute power to each of the resource boards 90 that are connected thereto. The power supply 128 preferably is designed to be a modular component designed to support whatever number of carrier assemblies 98 and resource boards 90 are connected thereto. Accordingly, the power supply 128 is not specific to any particular configuration 104, 106, 108. The power supply 128 preferably is a DC power supply that draws power from a standard AC electrical outlet. Alternatively, the power supply 128 may be a battery or any other suitable power source.

Figure 8:
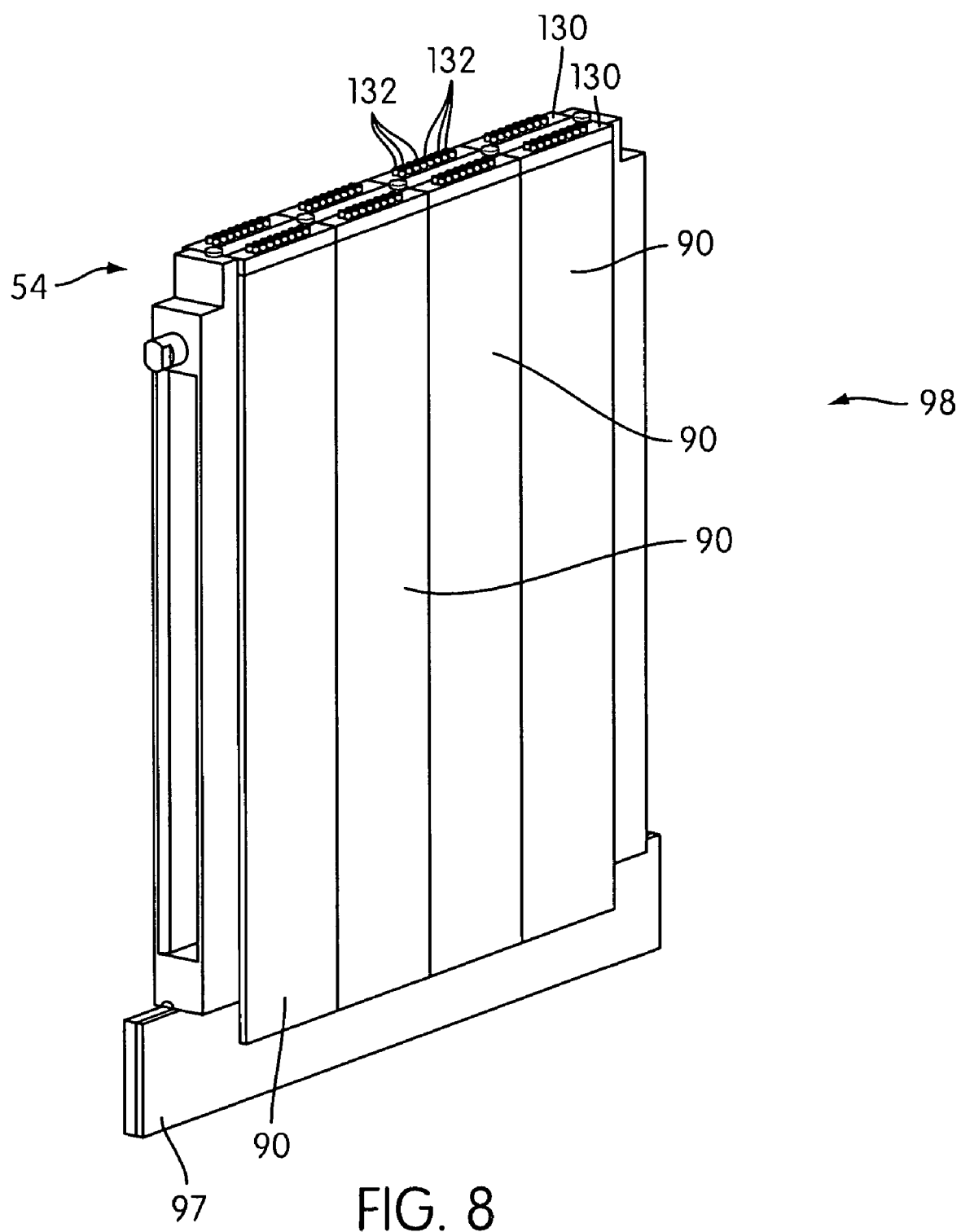
FIG. 8 is a perspective illustration of one of the carrier assemblies of the testing apparatus of the present invention.

FIG. 8 illustrates one contemplated embodiment for one of the carrier assemblies 98. Eight resource boards 90 are connected to the carrier assembly 98, four to each side. Each of the resource boards 90 includes a test pin assembly 130 at the top end thereof. In the illustrated embodiment, which is consistent with the remaining embodiments, each test pin assembly 130 preferably includes eight test pins 132 arranged in a 2×4 arrangement. The test pins 132 are connected to the hardware components incorporated on each resource board 90. The pins 132 are designed to contact the underside of the loadboard 120 and establish a communication link to the DUTs 12 being tested.

As should be appreciated by those skilled in the art, a fewer or greater number of test pins 132 may be incorporated into the testing apparatus 10 without departing from the scope of the present invention. In fact, throughout the drawings, the test pin assemblies 130 are shown with sixteen test pins 132 disposed in a 2×8 arrangement. The 2×8 arrangement is one possible alternative to the preferred embodiment.

The combined operation of the test pin assemblies 130 and the test pins 132 form the loadboard interconnect of the testing apparatus 10 of the present invention. As discussed above in connection with FIG. 1, the test head 54 connects the test apparatus 10 to the DUT 12. As also discussed above in connection with FIGS. 3, 4, 5, and 6, the test head 54 encompasses a number of components of the testing apparatus 10.

As may now be appreciated in connection with FIG. 8, collectively, the test pin assemblies 130 at the top ends of each of the resource boards 90 are constructed so that the test pins 132 presented by each of the test pin assemblies 130 align with one another. Accordingly, in the case where the test head 54 includes a single carrier assembly 98 with eight resource boards 90, each of which have eight test pins, the test head 54 includes a total of sixty-four test pins 132. For each carrier assembly 98 added to the test head 54, therefore, a total of sixty-four test pins 132 are added to the test head 54.

To facilitate an understanding of the testing apparatus 10 and testing system 14 of the present invention, reference will be made primarily to the loadboard 120 in the discussion that follows. Reference to the loadboard 120 is not intended to convey that only the loadboard 120 may be used for the present invention. As indicated above, any of the configurations for the loadboard 114, 120, 126 may be employed (as well as other configurations not illustrated) without departing from the present invention. Reference to loadboard 120 is intended to simplify discussion of the present invention.

Figure 9:
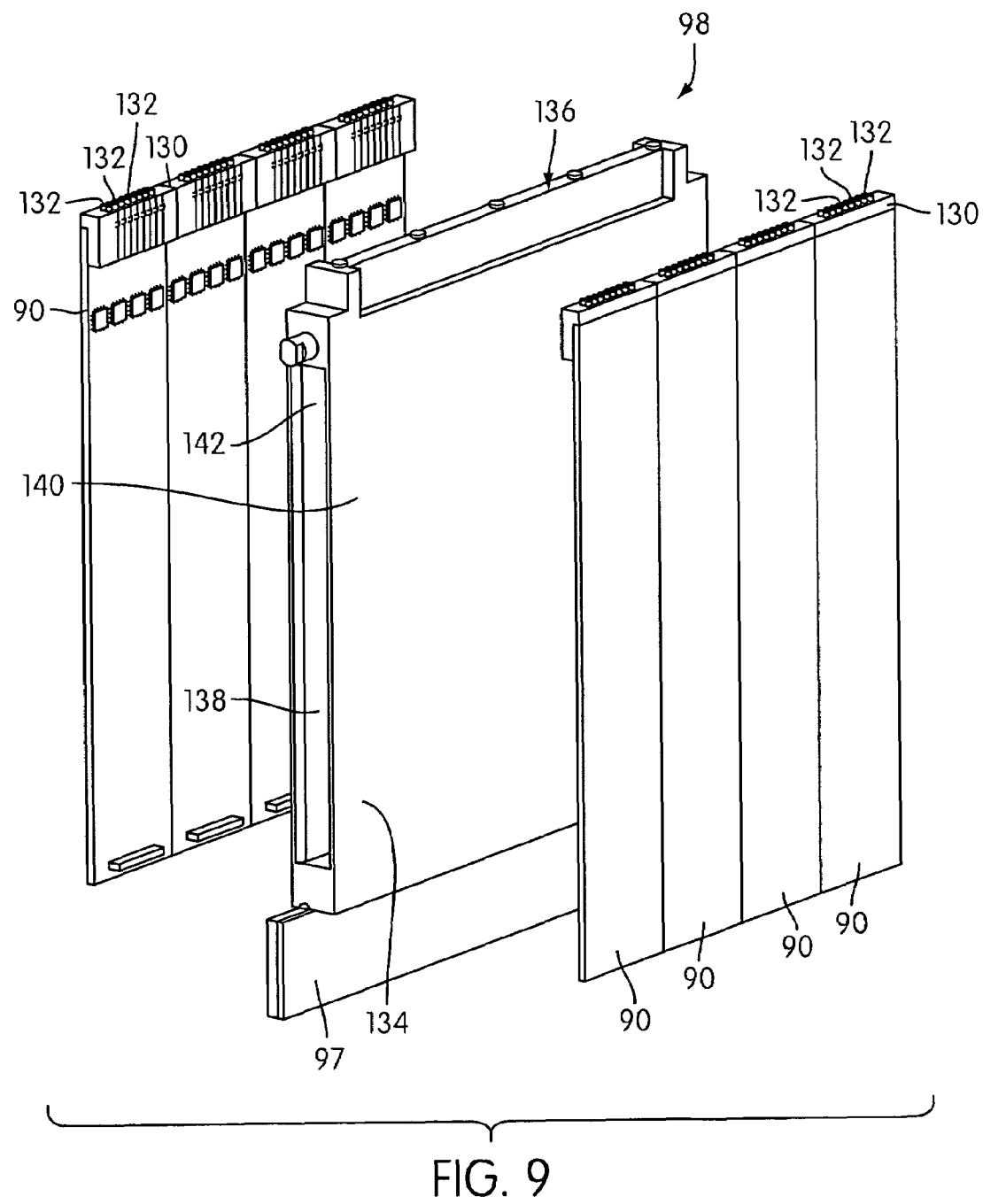
FIG. 9 is an exploded view of the carrier assembly shown in FIG. 8.

FIG. 9 illustrates the components, in an exploded format, of the carrier assembly 98 illustrated in FIG. 8. The eight resource boards 90 are shown separated from the carrier assembly 98 for ease of understanding of the configuration of the testing apparatus 10 and the testing system 14 of the present invention.

As illustrated in FIG. 9, the carrier assembly 98 includes the carrier board 97 that connects to the power supply 128 (illustrated in FIG. 7) via the backbone 96 (not illustrated). The carrier assembly 98 also includes a vertical support 134 at the top of which is a loadboard clamping mechanism 136 that is designed to hold the loadboard 120 in place in a manner to be described below. As would be appreciated by those skilled in the art, the configuration of the carrier assembly 98 is but one contemplated embodiment. Others are possible and are intended to be encompassed by the claims appended hereto.

The resource boards 90 plug into the carrier assembly 98 and communicate with the controller 16.

The carrier assembly 98 is illustrated with an air gap 138 between two vertical plates 140, 142. The air gap 138 permits the circulation of air between the vertical plates 140, 142 to cool the components on the eight resource boards 90 positioned adjacent thereto. Air may be circulated using a fan or other suitable air mover.

While the vertical plates 140, 142 are illustrated as solid plates, it should be understood that the vertical plates 140, 142 may include one or more ventilation openings therethrough to assist in the cooling of the resource boards 90.

As would be appreciated by those skilled in the art, the air gap 138 provides room for a cooling system, such as a liquid cooling system, if more aggressive cooling is needed for the resource boards 90. It is also contemplated that other types of cooling systems, including a liquid nitrogen cooling system, may be located in the air gap 138 if very aggressive cooling is required for the resource boards 90. In addition, while unlikely, the air gap 138 may include one or more heating elements, if the components of the resource boards 90 so require it.

Figure 10:
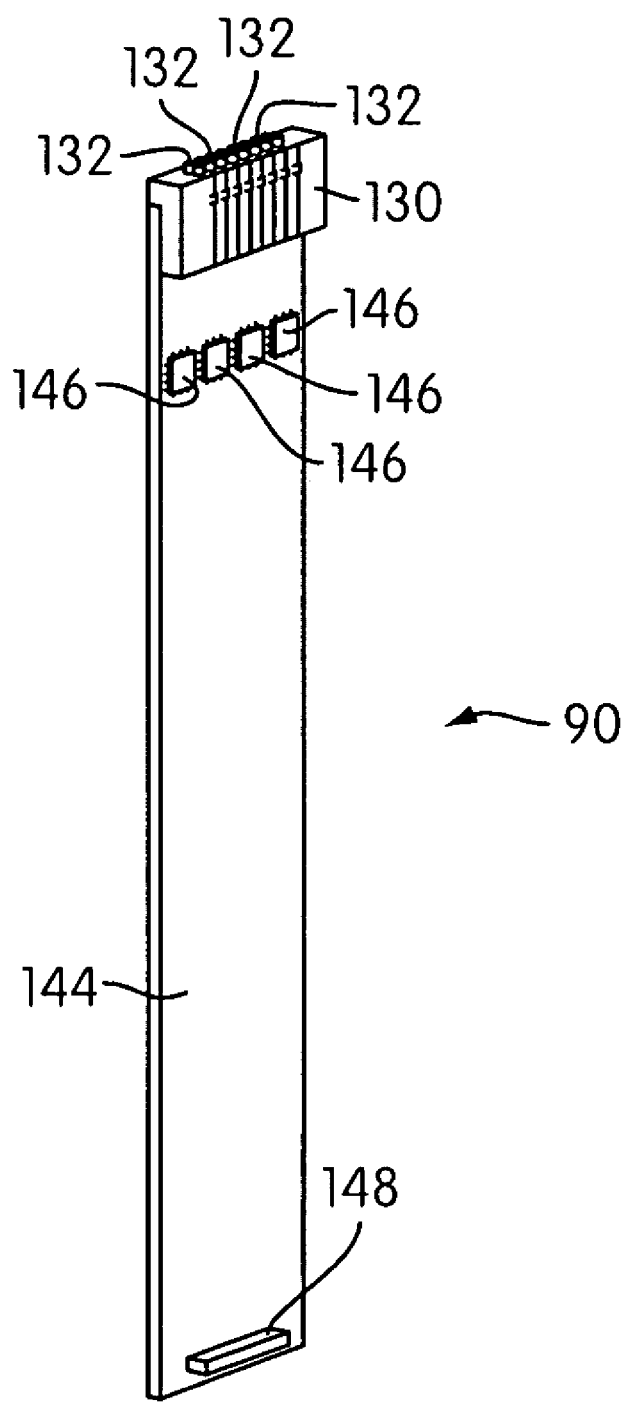
FIG. 10 is a perspective illustration of one of the resource boards illustrated in the exploded view shown in FIG. 9.

FIG. 10 illustrates one contemplated embodiment of a single resource board 90. As with other components of the testing apparatus 10 and the testing system 14 of the present invention, the illustration of the resource board 90 is intended to be exemplary of one contemplated configuration and is not intended to be limiting of the invention. A single resource board 90 is contemplated to have the following dimensions: 2.5 inches×12 inches (63.5 mm×304.8 mm). Of course, as would be appreciated by those skilled in the art, these dimensions are merely exemplary and are not meant to suggest that these are the only dimensions possible. In addition, it is contemplated that a single resource board 90 may be made up of one or more mini-resource boards (not illustrated). For example, a single resource board 90 may be made up of two mini-resource boards, connected end to end, each of which has the following dimensions: 2.5 inches×6 inches (63.5 mm×152.4 mm). Naturally, other dimensions of mini-resource boards are contemplated as well.

The resource board 90 includes a circuit board portion 144. The test pin assembly 130 is disposed at the top of the resource board 90. One or more hardware components 146 are incorporated on (or into) the resource board 90. The hardware components 146 are employed by the resource board 90 to perform the multiple different tests (or parts of tests) of the DUT 12. The hardware components 146 may include one or more semiconductor components by which instructions may be executed, as needed. As would be appreciated by those skilled in the art, the hardware components 146 may include any number of semiconductor components or electronic elements (such as resistors, capacitors, etc.) that make possible the operation of the resource board 90.

Each resource board also includes a carrier board connection 148 near the bottom end thereof. The carrier board connection 148 connects the resource board 90 to the carrier assembly 98. Power is distributed to the hardware components 146 via the carrier board connection 148. In addition, signals to and from the controller 16 pass through the carrier board connection 148 on each of the resource boards 90.

The carrier board connections 148 are intended to have the same structure for each of the resource boards 90 regardless of the particular configuration of the hardware components 146 for that resource board 90. As a result, the resource boards 90 may be inserted into any location on the carrier assemblies 98. In other words, the resource boards 90 are not required to reside at any particular location on the carrier assembly 98. The carrier board connection 148 is universal to any of the eight possible locations on each of the carrier assemblies 98.

Figure 11:
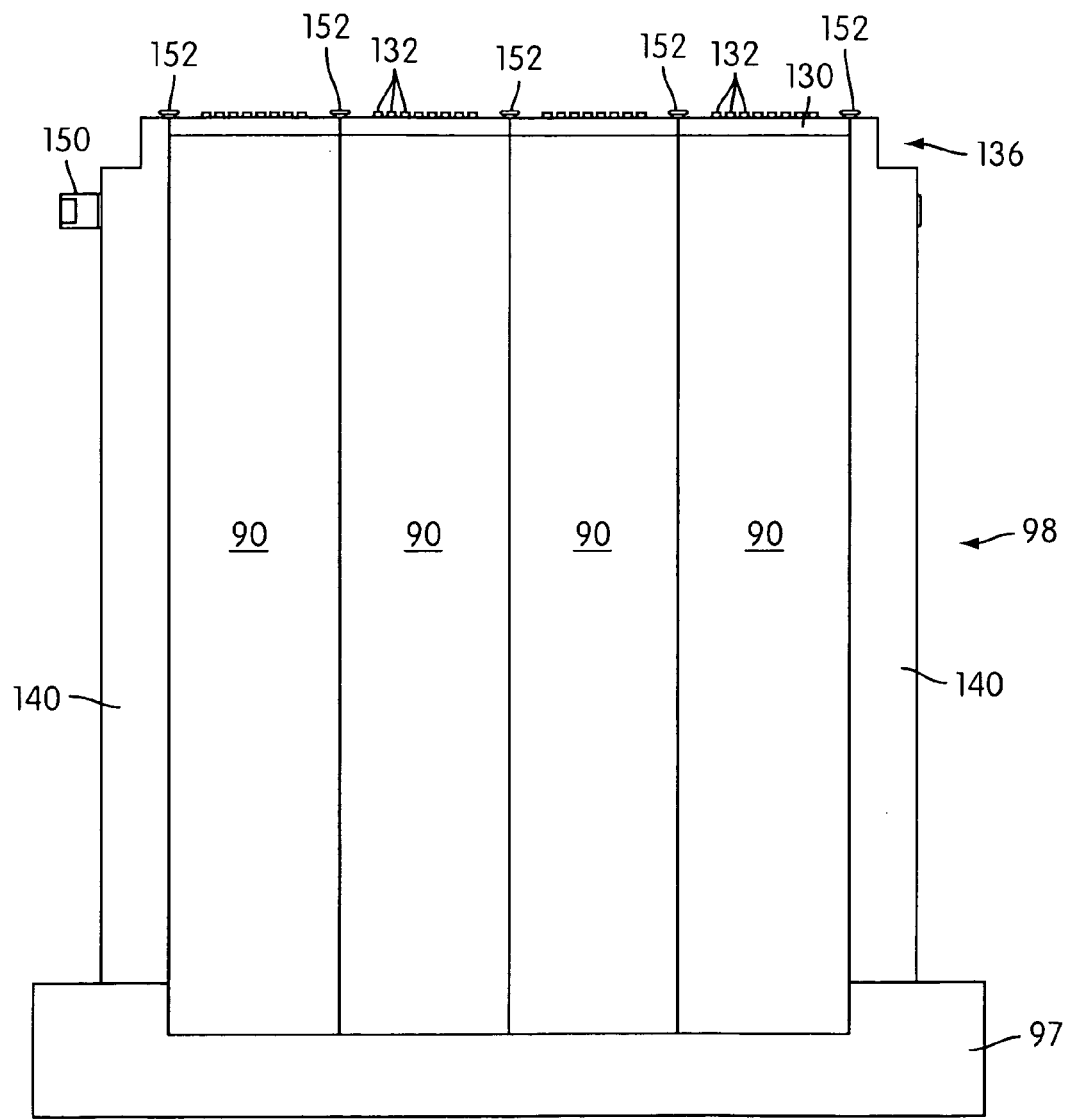
FIG. 11 is a front elevational view of one embodiment of a carrier assembly according to the present invention.

FIG. 11 presents a side elevational view of the carrier assembly 98. Four of the resource boards 90 are shown arranged in a side-by-side configuration. The carrier board 97 of the carrier assembly 98 and the test pin assemblies 130 are illustrated. Also illustrated is the loadboard clamping mechanism 136. The loadboard clamping mechanism 136 includes a rotatable knob 150 that is operatively connected to several T-shaped pins 152. Rotation of the knob 150 causes the T-shaped pins 152 to extend and retract in the vertical direction, permitting the carrier assembly 98 to grasp onto a portion of the loadboard 120, as will be discussed in greater detail below.

Figure 12:
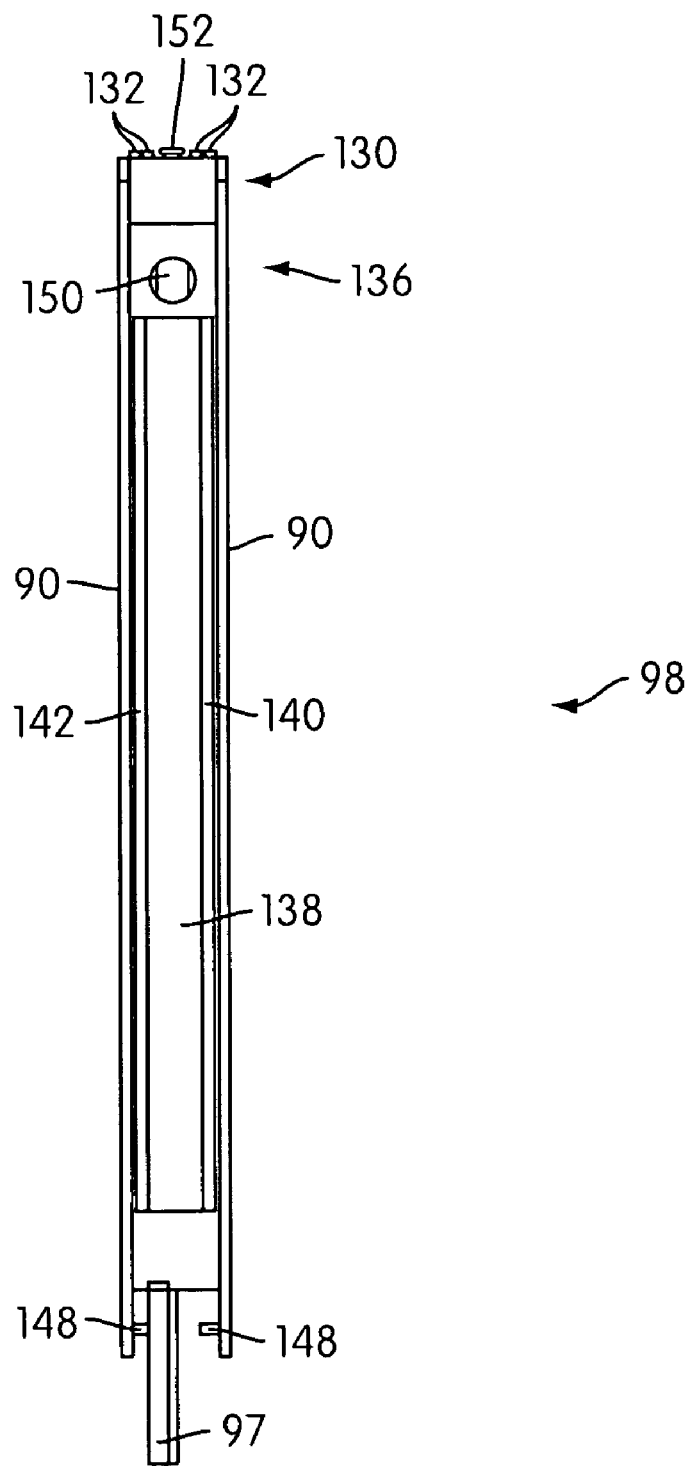
FIG. 12 is a side elevational view of the carrier assembly illustrated in FIG. 11.

FIG. 12 provides an elevational side view of one of the carrier assemblies 98 of the present invention. In this depiction, the air gap 138 is noticeably visible. The vertical plates 140, 142 also are visible adjacent the resource boards 90.

Figure 13:
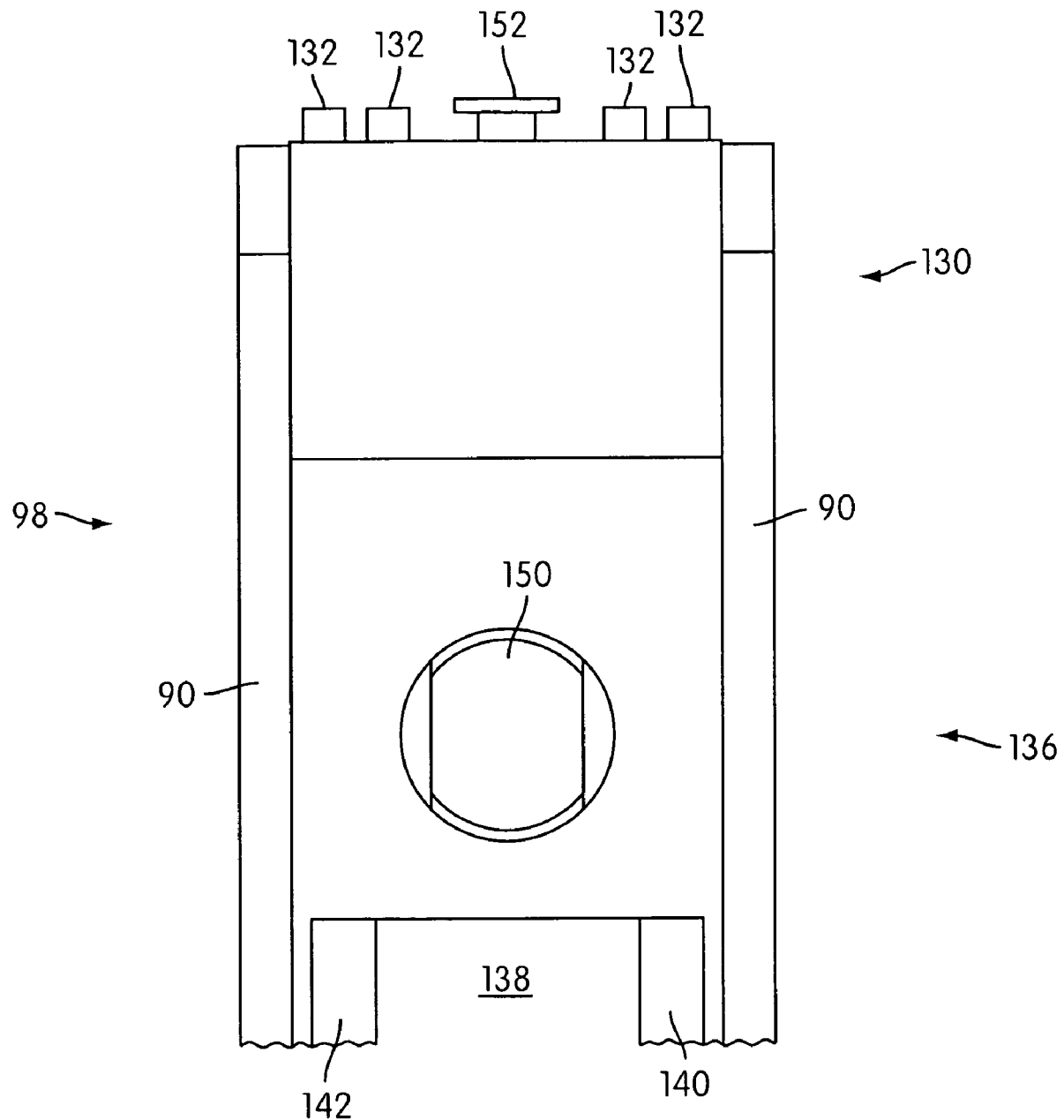
FIG. 13 is an enlarged side view of the top end of the carrier assembly illustrated in FIG. 12, showing one embodiment of the test pin assembly and locking mechanism of the present invention.

FIG. 13 is an enlarged end view of the top portion of a carrier assembly 98. The knob 150 is illustrated in roughly the center of the loadboard clamping mechanism 136. The top portions of two of the resource boards 90 are illustrated adjacent to the vertical plates 140, 142. The tops of the pins 132 may be seen extending outwardly from the top of the test pin assembly 130. One of the T-shaped pins 152 also is plainly visible in this illustration.

Figure 14:
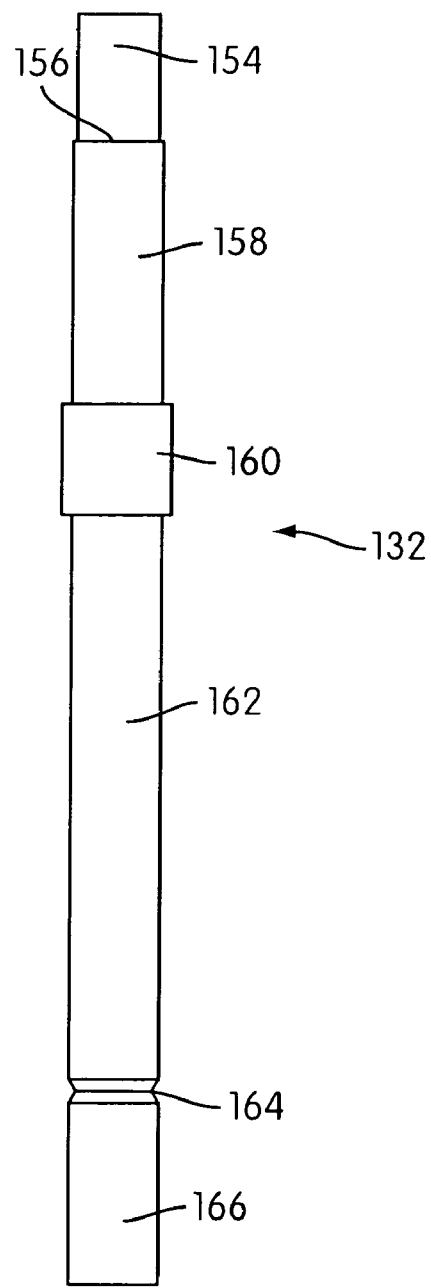
FIG. 14 is a side view of one embodiment of a test pin according to the present invention.

FIG. 14 is a side view illustration of one of the pins 132 disposed in the test pin assembly 130 at the top of each of the resource boards 90. As shown, each pin 132 has a top end 154 that extends to a transition 156. The diameter of the top end 154 is less than the diameter of the top barrel portion 158 of the pin 132 that extends downward from the transition 156. The top barrel portion 158 extends downwardly from the transition 156 to a stop portion 160. The stop portion 160 is a segment of the pin 132 where the diameter is greater than the diameter of the top barrel portion 158 or the bottom barrel portion 162 that extends downwardly from the stop portion 160. The bottom barrel portion 162 extends downwardly from the stop portion 160 to a radial recess 164 near to the bottom end 166 of the pin 132. As would be appreciated by those skilled in the art, the configuration of the pin 132 facilitates retention of the pin 132 in the test pin assembly 130.

Figure 15:
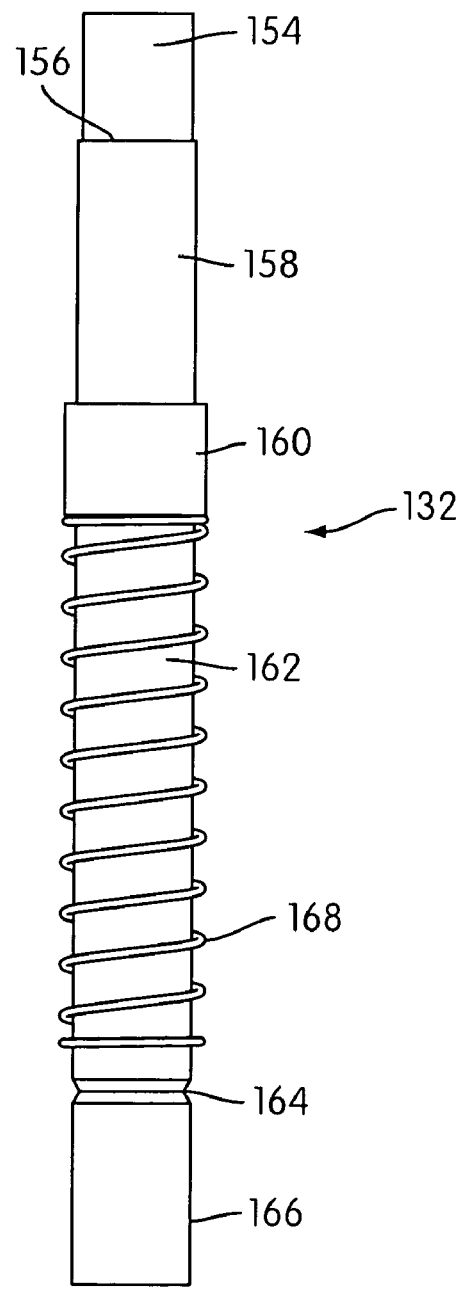
FIG. 15 is a side view of the embodiment of a test pin according to the present invention as illustrated in FIG. 14, including an external coil spring.

FIG. 15 is a side view illustration of the pin shown in FIG. 14. In this illustration, an external coil spring 168 is shown surrounding the lower barrel portion 162 between the stop portion 160 and the radial recess 164. As would be appreciated by those skilled in the art, each of the test pins 132 are biased in the test pin assemblies 130 such that the exposed ends 154 of the pins 132 extend outwardly above the top surface of the housing for the test pin assemblies 130. When in contact with the loadboard 120, the pins 132 are pressed downwardly into the housing of the test pin assemblies 130. With the upward bias, the pins 132 are forced into constant contact with the loadboard 120.

An integrated loadboard clamping mechanism is disposed within the carrier assembly 98 to provide attachment of the loadboard 120. The clamp mechanism is positioned within each carrier assembly 98 to provide attachment capability to the loadboard 120 for each carrier assembly 98. The clamping mechanism provides the necessary forces to make contact with the loadboard 120 through spring-loaded contacts. The forces required to compress the spring contacts are localized to the area associated with the spring contacts and do not impose additional pressure throughout the loadboard 120, which might cause warping of the loadboard 120.

It is noted at this point that warping of the loadboard is one difficulty associated with the prior art. Specifically, in prior art testing devices, the loadboard is encased within a heavy aluminum ring. The prior art tester typically grabs onto the aluminum ring and pulls the loadboard against the test apparatus pneumatically or mechanically. One difficulty associated with this prior art attachment device lies in the fact that the aluminum ring applies pressure to the loadboard only at the edges. Accordingly, the force applied to the loadboard is greatest at the edges. To assure that the loadboard contacts the test apparatus, excessive pressure may be applied such that the loadboard becomes warped or "bubbles" from the edges to the center point of the loadboard. As a result, there is the potential that the force of the loadboard on the contacts is not uniform across the surface of the loadboard. In addition, the aluminum ring typically is heavy, expensive, and costly to manufacture. As a result, there has developed a need for a mechanism to apply uniform pressure to the loadboard without the need for the aluminum ring. The loadboard clamping mechanism 136 of the present invention offers one solution to this difficulty with the prior art.

Figure 16:
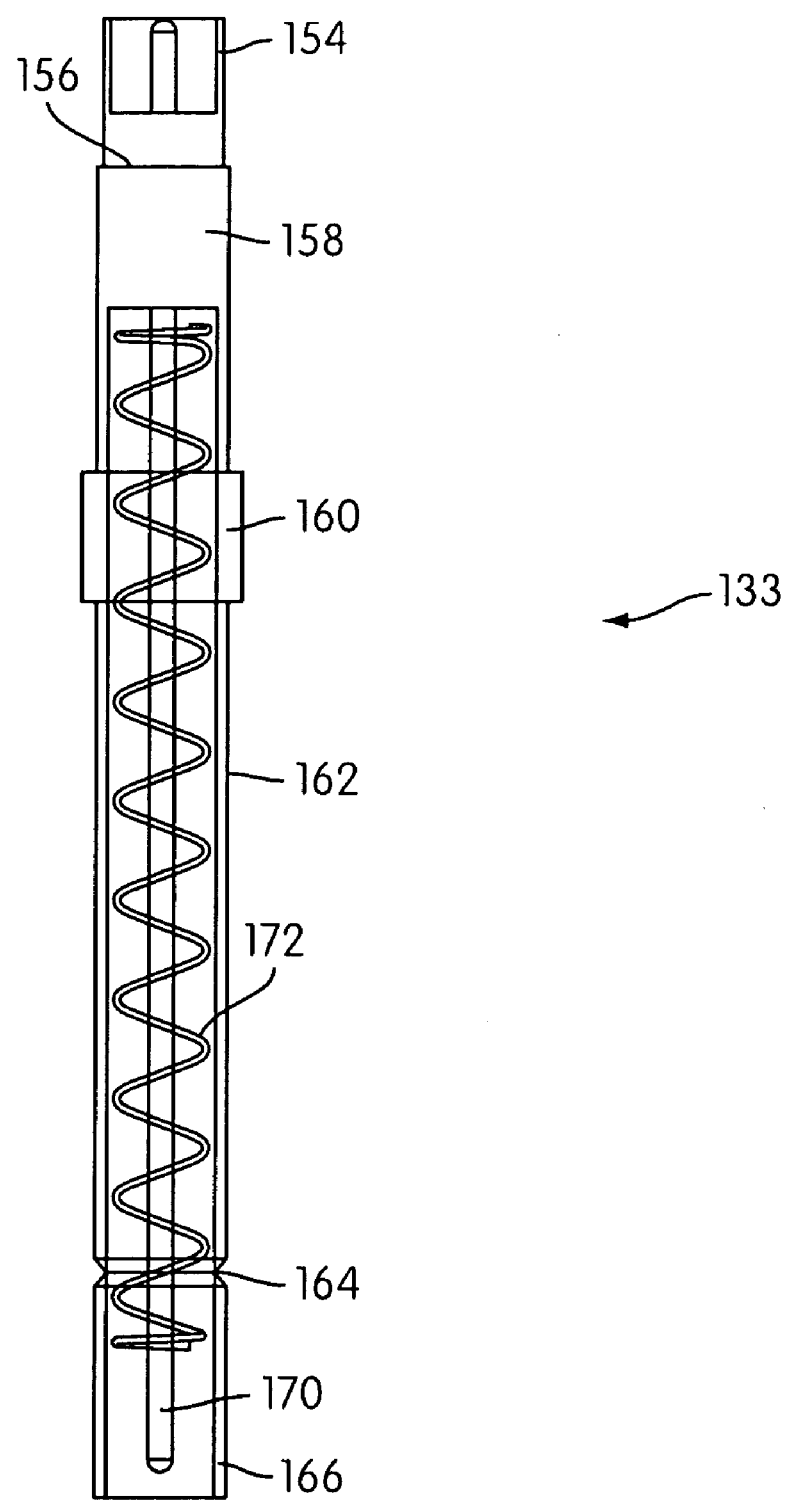
FIG. 16 is a cross-sectional view of an alternative test pin to the one illustrated in FIGS. 14 and 15.

FIG. 16 provides an interior detail of an alternate embodiment of the pin 132 illustrated in FIGS. 14 and 15. As shown, each pin 133 includes an interior pin 170 and an interior coil spring 172 which assists with maintaining contact between the pin 133 and the loadboard 120. In this embodiment, the spring 172 is interior to the pin 133, rather than being exterior thereto, as in the embodiment illustrated in FIGS. 14 and 15. As FIG. 16 shows, the exterior details of the test pin 133 is the same as the exterior detail of the test pin 132. As would be appreciated by those skilled in the art, the test pin 133 operates in the same manner as the test pin 132 except that the interior pin 170 may extend to contact the loadboard 120.

FIGS. 17-25 pictorially assist in providing an understanding of how the loadboard 120 is connected to the test pins 132. It is noted that, while reference is made to test pin 132 throughout this discussion, it should not be understood that such discussions is intended to exclude the construction of test pin 133. To the contrary, test pin 133 may be employed without departing from the scope of the present invention.

Figure 17:
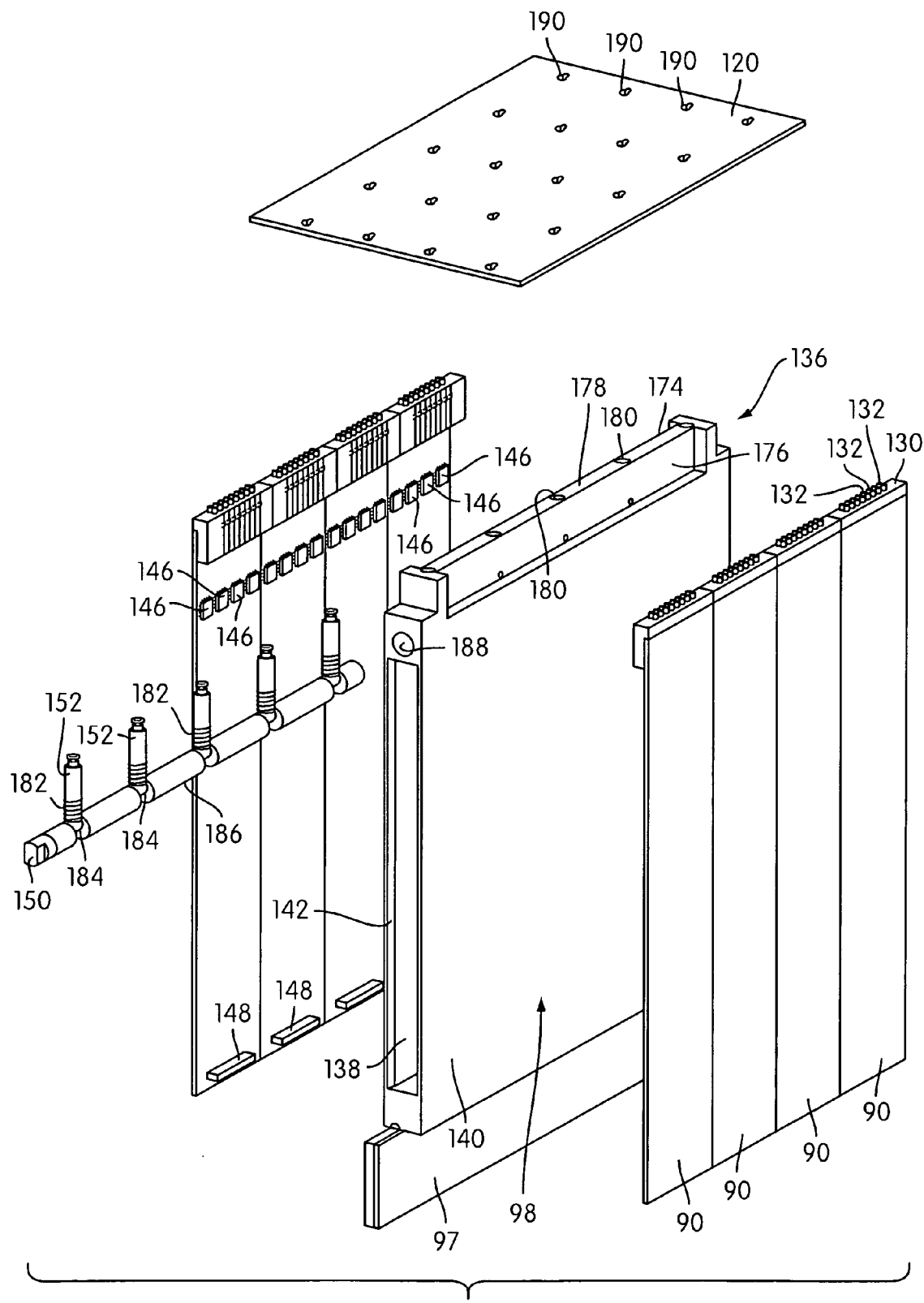
FIG. 17 is an exploded view of a portion of the testing apparatus of the present invention, illustrating the positional relationship between the carrier assembly, resource boards, loadboard, and loadboard clamping mechanism of the present invention.

FIG. 17 is an exploded perspective illustration of portions of the loadboard clamping mechanism 136 of the present invention. The loadboard clamping mechanism 136 of the present invention employs a number of elements that permit a uniform pressure to be applied to the loadboard 120 to ensure that the loadboard 120 contacts the test pins 132 with uniform pressure across the width and depth of the loadboard 120.

Rather than concentrating the forces on the loadboard 120 at the edges thereof, which has been the traditional practice, the testing apparatus 10 of the present invention takes advantage of the design of the individual carrier assemblies 98 by incorporating into each carrier assembly 98 a loadboard clamping mechanism 136.

As illustrated in FIG. 17, the loadboard clamping mechanism 136 includes the loadboard clamping mechanism head 174, which is incorporated at the top of each carrier assembly 98. The loadboard clamping mechanism head 174 includes detents 176 on either side thereof to accommodate the test pin assemblies 130 at the top of each of the resource boards 90. The top surface 178 is the horizontally-oriented surface against which the loadboard 120 is pressed so that the loadboard uniformly contacts with the test pins 132. As illustrated in FIG. 17, the top surface 178 includes a plurality of holes 180 therethrough. The T-shaped pins 152 extend through the holes 180.

The T-shaped pins 152 are biased in the holes 180 such that the T-shaped pins 152 apply a downward force on the loadboard 120. Coil springs 182, disposed around the bottom portions of the shafts of the T-shaped pins 152 pull the T-shaped pins 152 into the holes 180. The bottom ends of the T-shaped pins 152 engage cams 184 on a camshaft 186, which is rotatable within the hole 188 extending horizontally through the loadboard clamping mechanism head 174. The tops of the T-shaped pins 152 engage eyelet holes 190 (or keyholes) disposed through the loadboard 120.

The operation of the camshaft 186, T-shaped pins 152, and the knob 150 will now be described in connection with FIGS. 18-25.

Figure 18:
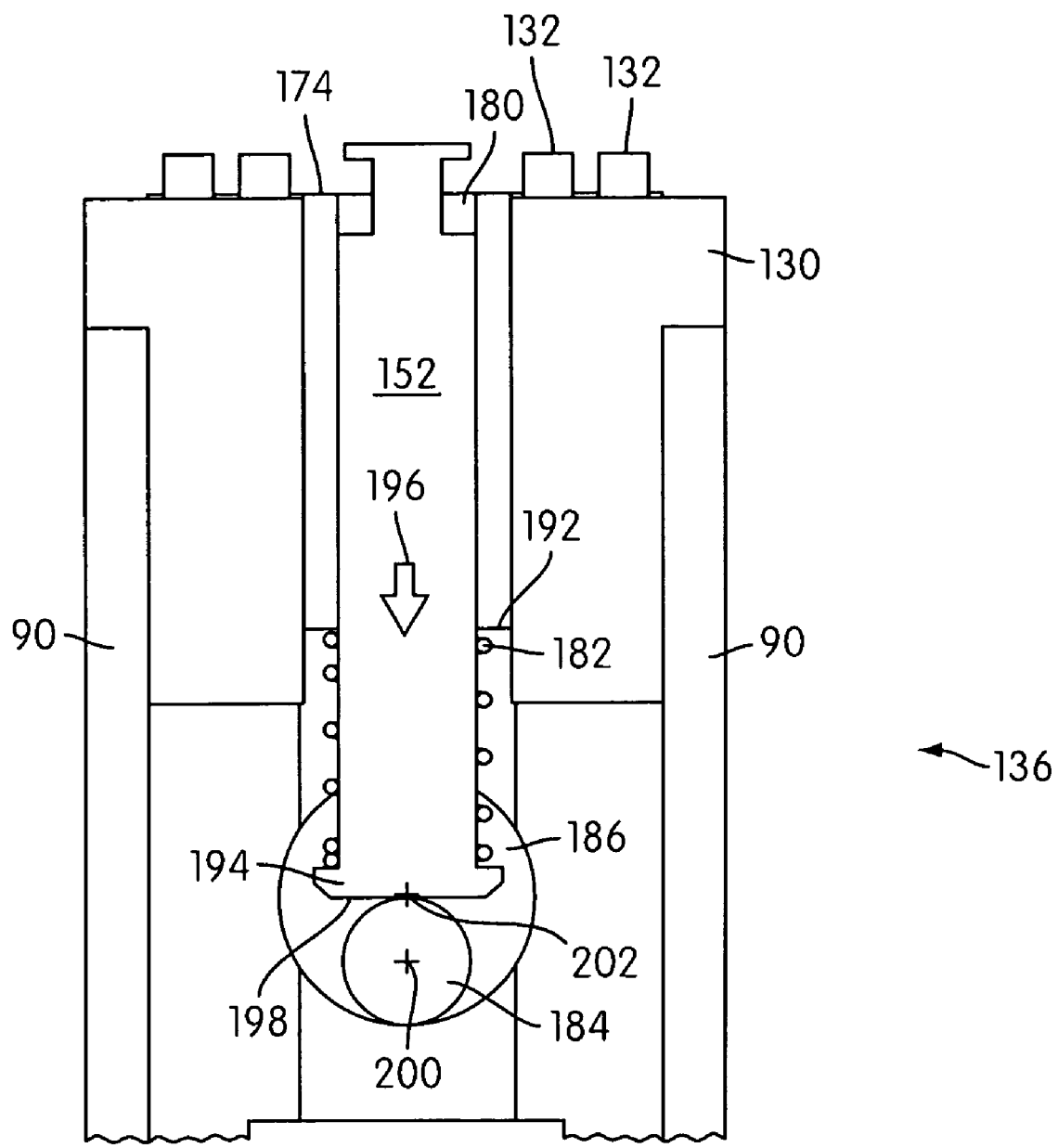
FIG. 18 is a cross-sectional end view of the loadboard clamping mechanism of the present invention, illustrating one of the locking pins in a first position.

FIG. 18 illustrates one of the T-shaped pins 152 in the retracted position. As discussed previously, the T-shaped pin 152 is disposed in one of the holes 180 in the loadboard clamping mechanism head 174. The hole 180 in the loadboard clamping mechanism head 174 includes an abutting surface 192. The coil spring 182 expands between the abutting surface 192 and the bottom flange 194 of the T-shaped pin 152. The coil spring 182 applies a force on the T-shaped pin 152 to bias the T-shaped pin 152 in the direction of the downward arrow 196. Accordingly, the bottom surface 198 of the T-shaped pin 152 is biased against the peripheral surface of the cam 184. As is apparent in FIG. 18, the axis 200 of the cam 184 is offset from the axis 202 of the camshaft 186.

Figure 19:
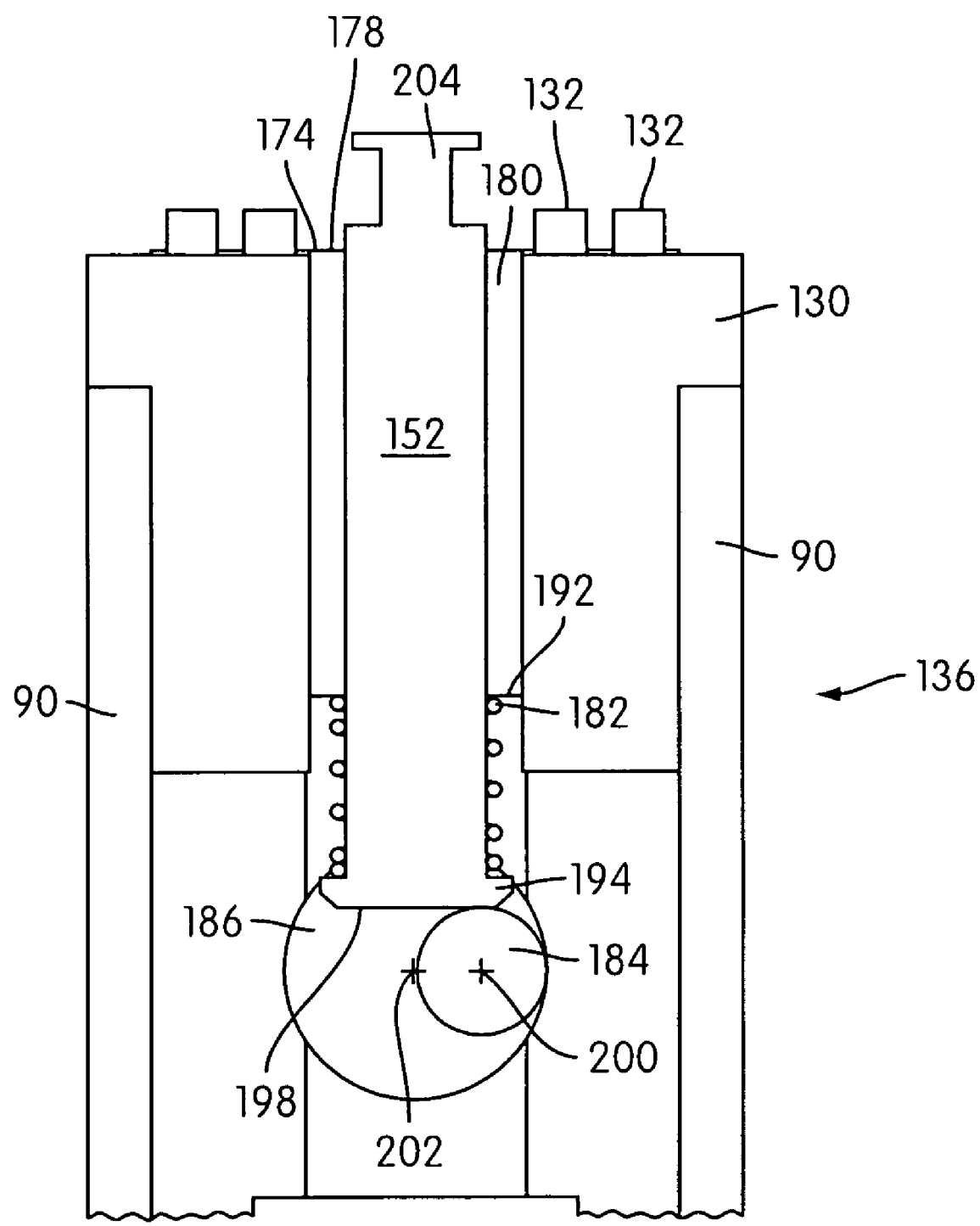
FIG. 19 is a cross-sectional end view of the loadboard clamping mechanism of the present invention, illustrating one of the locking pins in a second position.

FIG. 19 illustrates the same structure illustrated in FIG. 18 except that the camshaft 186 has been rotated by ninety degrees from the previous position. As a result of the rotation of the camshaft 186, the T-shaped pin 152 is pushed upwardly against the bias of the coil spring 182 to force the top end 204 of the T-shaped pin 152 above the top surface 178 of the loadboard clamping mechanism head 174.

Figure 20:
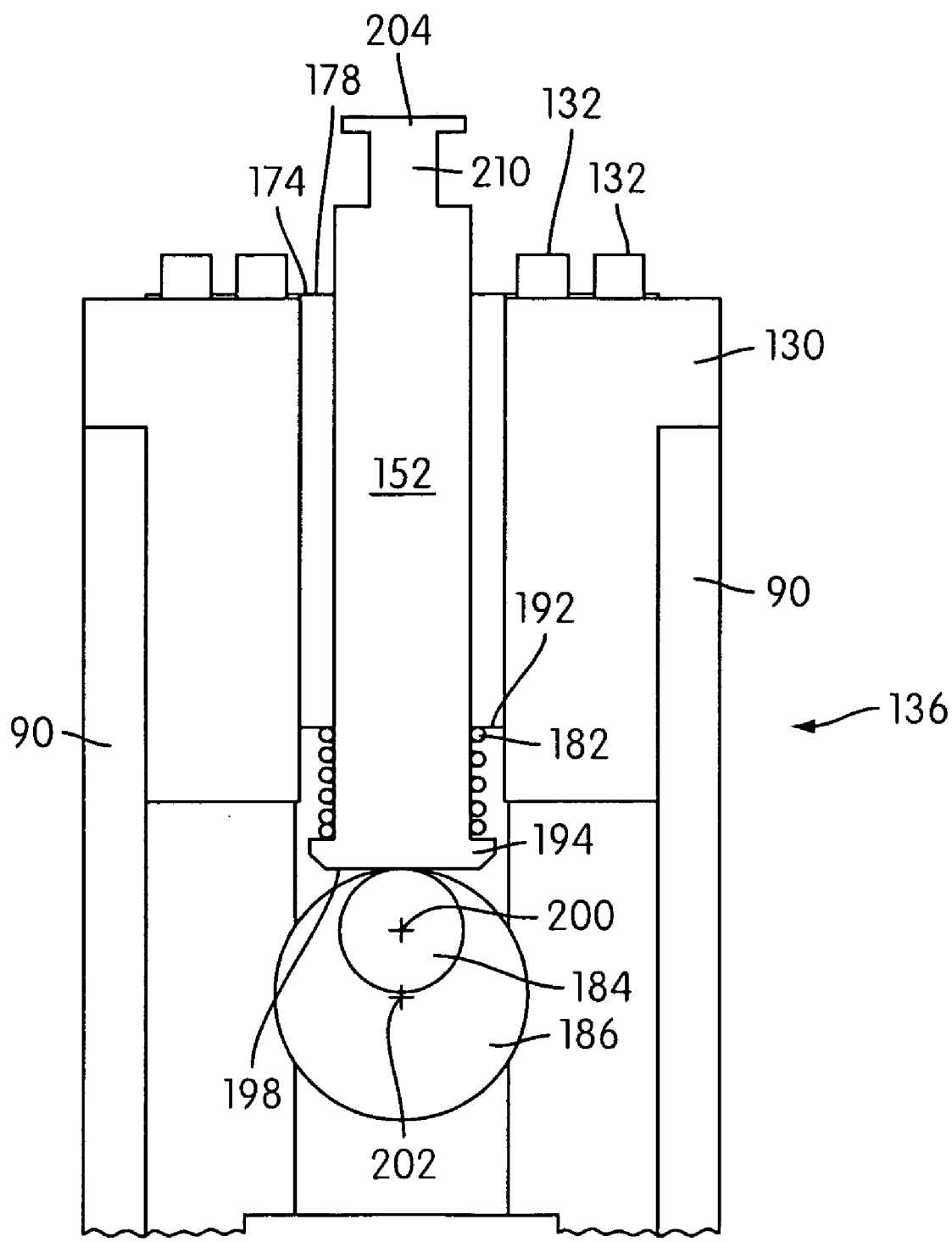
FIG. 20 is a cross-sectional end view of the loadboard clamping mechanism of the present invention, illustrating one of the locking pins in a third position.

FIG. 20 illustrates the position of the T-shaped pin 152 when the camshaft 186 has been rotated one hundred eighty degrees from the position illustrated in FIG. 18. In this position, the top end 204 of the T-shaped pin 152 is extended to a maximum position, permitting the loadboard 120 to be captured by the T-shaped pins 152 via the eyelet holes (or "keyholes") 190 in the loadboard 120.

Figure 21:
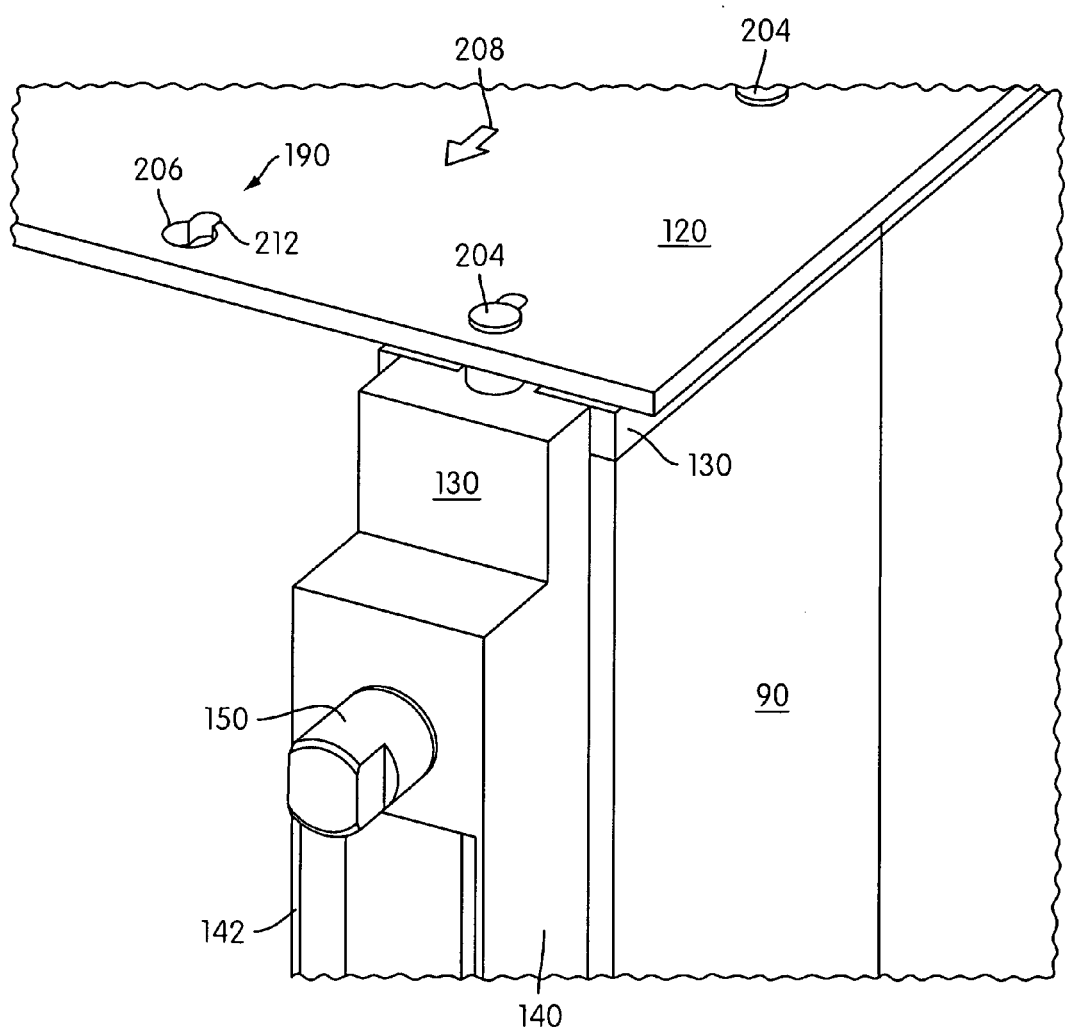
FIG. 21 is a perspective illustration of a portion of the present invention, showing the positional relationship between the loadboard clamping mechanism and the loadboard in a first position.
Figure 22:
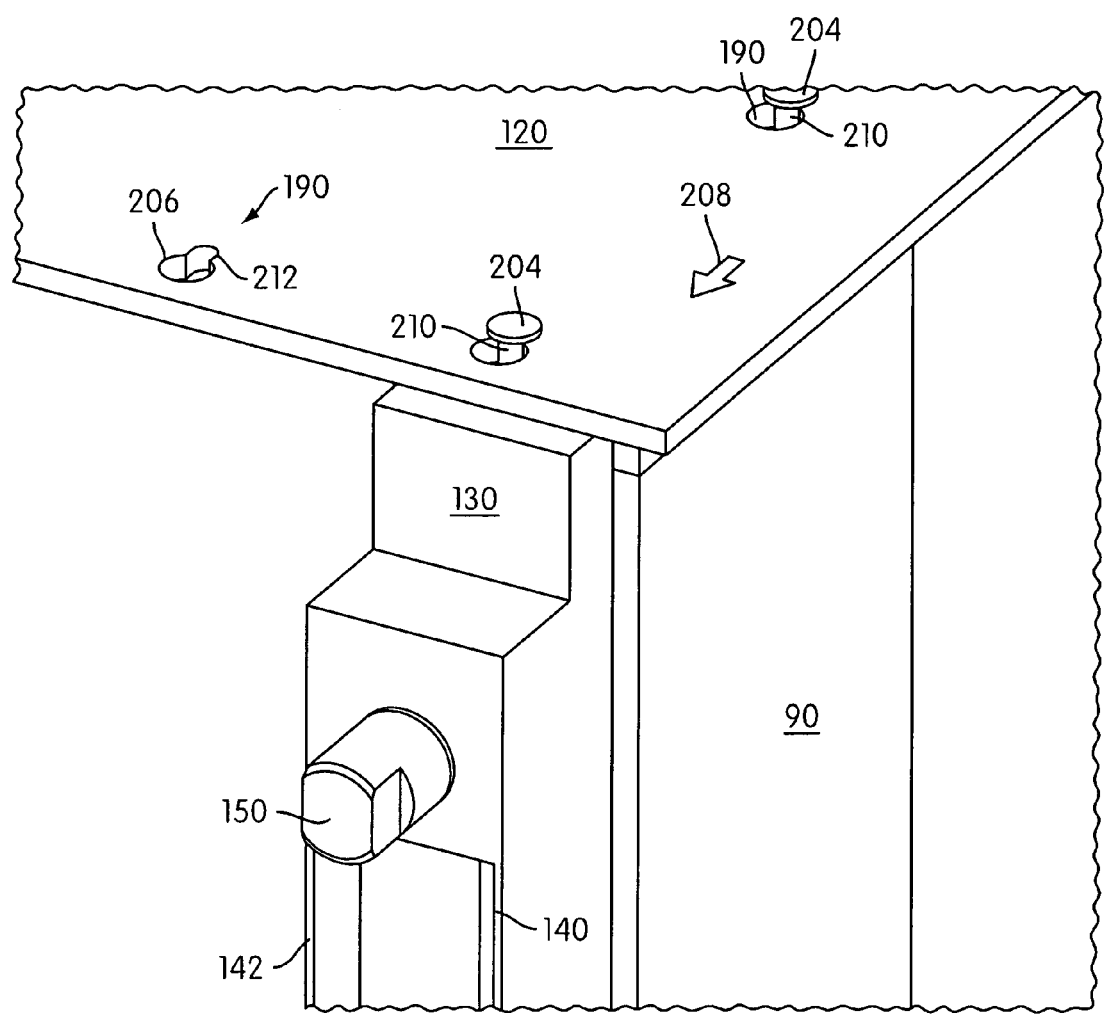
FIG. 22 is a perspective illustration of a portion of the present invention, showing the positional relationship between the loadboard clamping mechanism and the loadboard in a second position.

FIG. 21 illustrates the T-shaped pin 152 extended in the position shown in FIG. 20. In this position, the top end 204 of the T-shaped pin 152 passes through the circular portion 206 of the eyelet hole 190. The loadboard 120 may then be shifted laterally in the direction of the arrow 208. As a result of this shift, the narrowed portion 210 of the T-shaped pin 152 will slide into the elongated portion 212 of the eyelet hole 190. When the camshaft 186 is rotated again to the position illustrated in FIG. 18, the T-shaped pin 152 is biased downwardly so that the top portion 204 captures the loadboard 120 and presses the loadboard 120 against the pins 132. FIG. 22 illustrates the position of the top portions 204 of the T-shaped pins 152 after the loadboard 120 is shifted laterally in the direction of the arrow 208.

Figure 23:
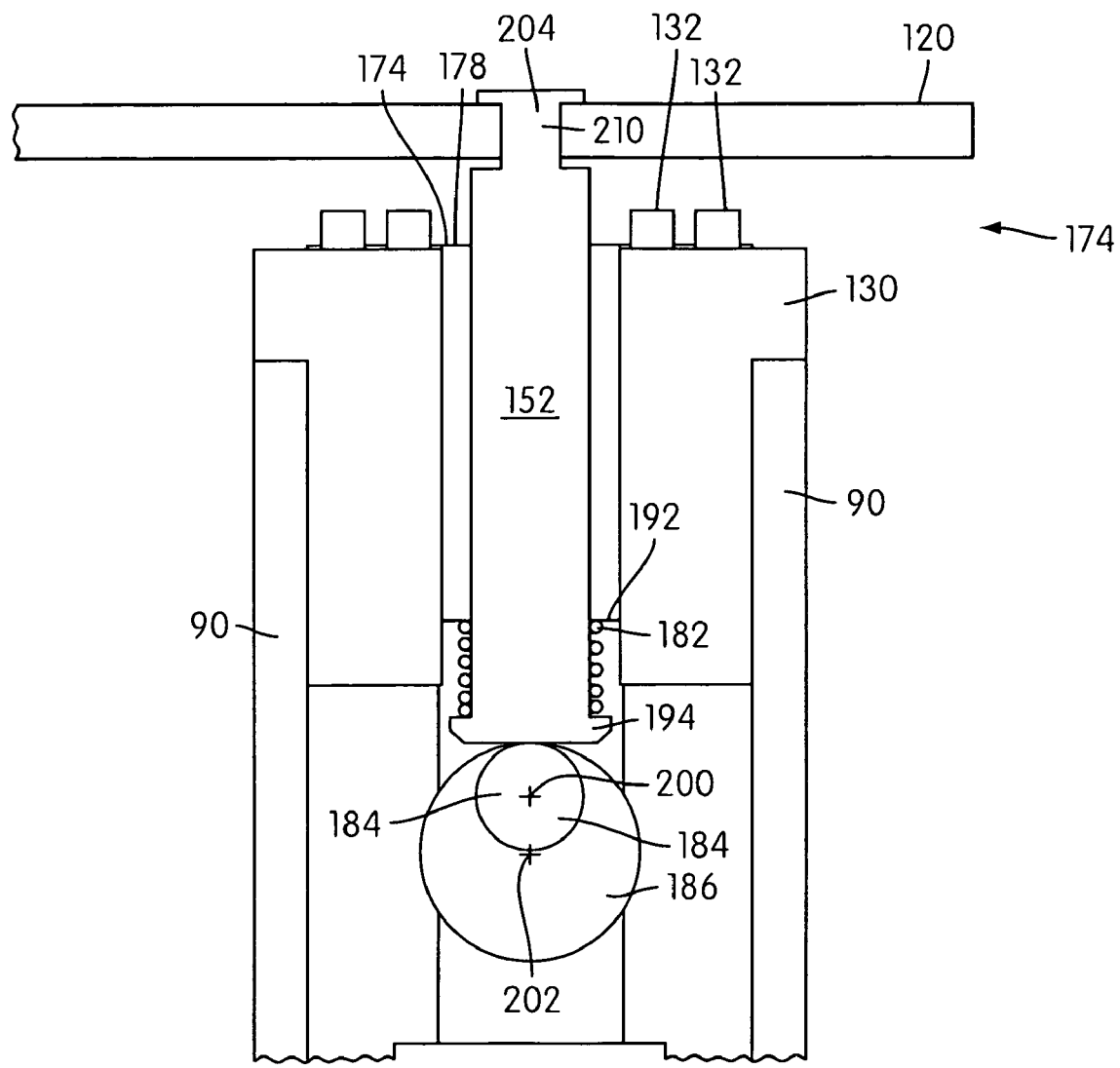
FIG. 23 is a cross-sectional view of a portion of the present invention, illustrating the positional relationship between the loadboard clamping mechanism and the loadboard in a first position.
Figure 24:
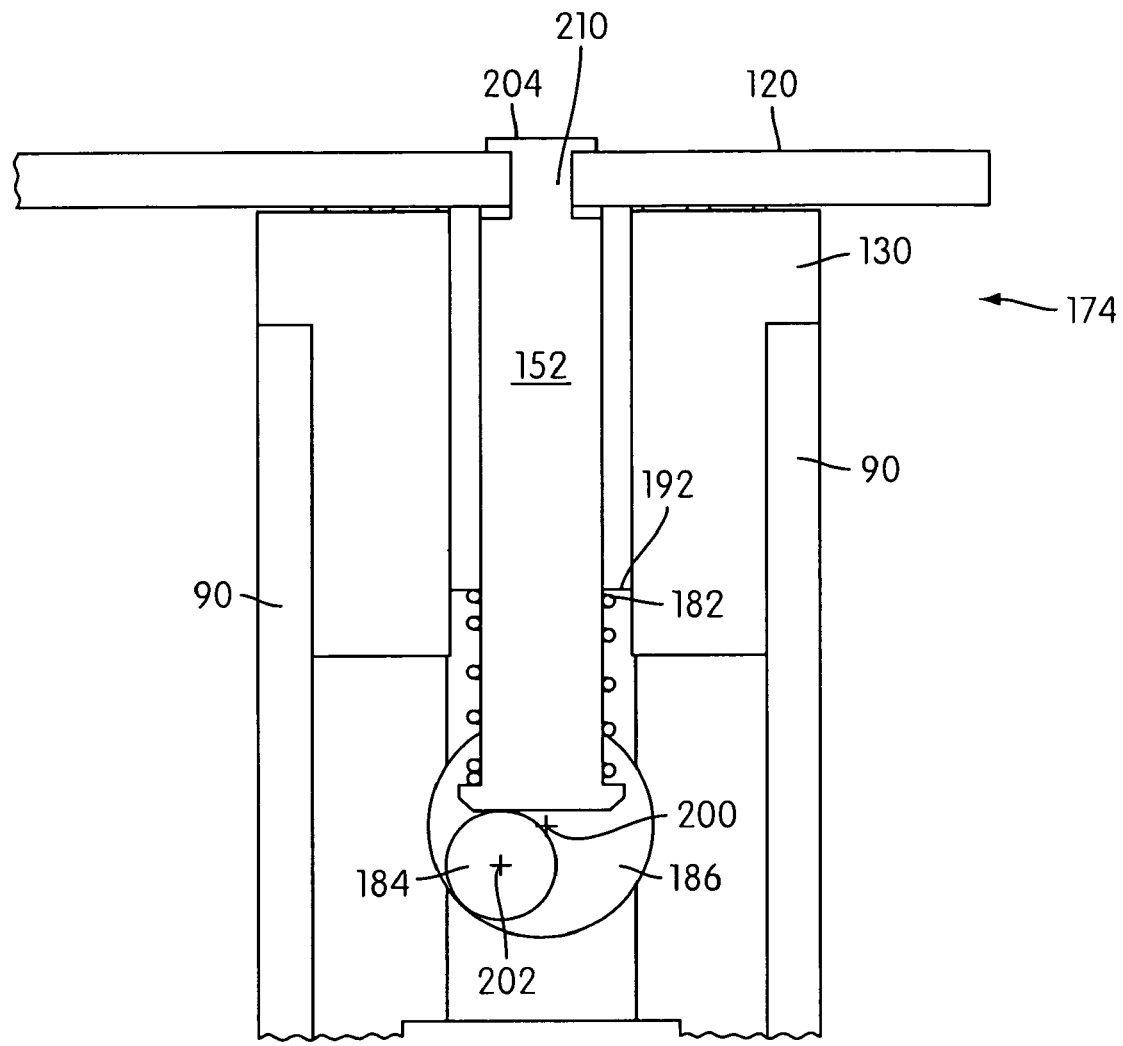
FIG. 24 is a cross-sectional view of a portion of the present invention, illustrating the positional relationship between the loadboard clamping mechanism and the loadboard in a second position.
Figure 25:
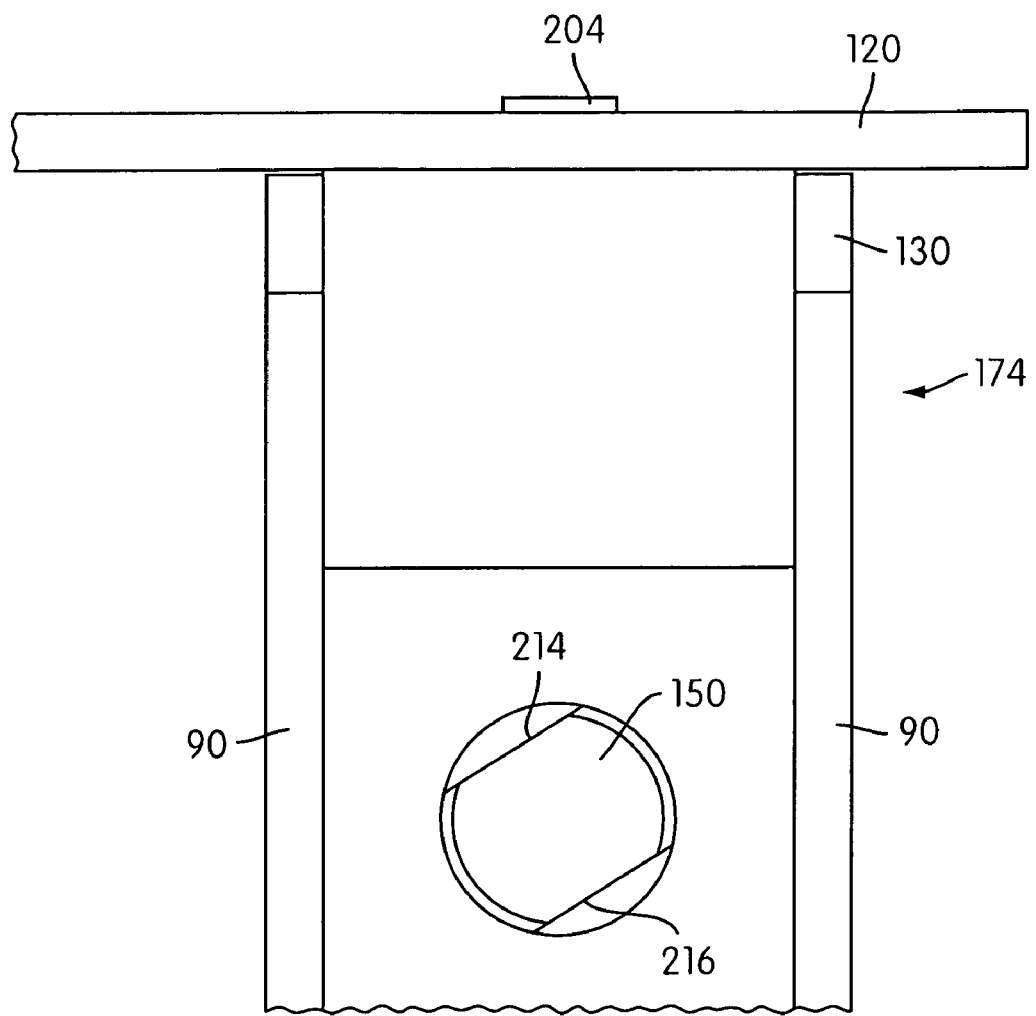
FIG. 25 is an external view of a portion of the present invention, illustrating the positional relationship between the loadboard clamping mechanism and the loadboard in the locked position.

FIGS. 23-25 illustrate the rotation of the camshaft 186, thereby drawing the loadboard 120 against the pins 132.

In FIG. 23, the cam 184 is disposed at the top position with respect to the camshaft 186. Accordingly, the T-shaped pin 152 is at its highest position with respect to the test pin assembly 130. As shown, the loadboard 120 has been captured by the T-shaped pin 152 and is in a condition to be pulled against the test pins 132.

FIG. 24 illustrates retraction of the T-shaped pin 152, at least partially. The camshaft 186 has been rotated about one hundred thirty-five degrees from the top position illustrated in FIG. 23. Accordingly, the loadboard 120 has been pressed against the pins 132 but has not yet been pulled completely onto the top surface 178 of the loadboard clamping mechanism head 174.

FIG. 25 is an exterior side view of the loadboard clamping mechanism head 174, illustrating the loadboard 120 after it has been pulled against the loadboard clamping mechanism head 174. The exterior of the knob 150 is also illustrated.

The knob 150 includes two flattened portions 214, 216 in opposed relation to one another. The flattened portions are designed for simple engagement with a rotating mechanism (not shown). In one contemplated embodiment, the flattened portions 214, 216 may engage an automated rotating mechanism that will rotate the camshaft 186 for movement of the T-shaped pins 152. It is also contemplated that the knob 150 may be rotated manually. Regardless of the mechanism by which the knobs 150 are rotated or the amount of force applied when the knob 150 is rotated, the present invention is constructed preferably such that a uniform force is applied to the loadboard 120 each time that a loadboard 120 is connected to the testing apparatus 10.

As is apparent from FIG. 17, for example, each loadboard clamping mechanism head 174 preferably incorporates five T-shaped pins 152, although any suitable number of T-shaped pins 152 and any alternative shape is intended to fall within the scope of the present invention. Each of the T-shaped pins 152 contacts with a separate cam 184 on the camshaft 186. Since the axes 200 of each of the cams 184 are positioned at the same radial position with respect to the axis 202 of the camshaft 186, all of the cams 184 will rotate in unison with the turning of the knob 150. Accordingly, each of the T-shaped pins 152 will move in unison as the camshaft 186 rotates. Since each of the T-shaped pins 152 are biased in a downward direction by the coil springs 182, if the spring constant of the coils springs 182 is the same for each (or at least substantially the same for each), each of the coil springs 182 will apply the same or a substantially similar force on the associated T-shaped pin 152. As a result, each of the T-shaped pins 152 will apply a substantially consistent force on the loadboard 120 at each of the locations where the top portions 204 of the T-shaped pins 152 engage the eyelet holes 190.

One additional aspect of the present invention concerns the knobs 150, camshafts 186, and cams 184. Specifically, as illustrated in FIGS. 4, 5, and 6, the testing apparatus 10 of the present invention is intended to be modular, meaning that multiple carrier assemblies 98 may be included within the housing for the particular configuration for the testing apparatus 10. As such, it is anticipated that there will be several knobs 150 within the housing that will need to be rotated simultaneously. Since each of the camshafts 186 are designed to rotate via application of a rotational force thereon, the plural knobs 150 may be connected to a singular mechanism that rotates all of the knobs 150 at the same time. The actuator that rotates the knobs 150 may be incorporated into the housing of the testing apparatus 10.

While a mechanically-actuated loadboard clamping mechanism 136 is described herein, it is contemplated that other arrangements may be employed without departing from the scope of the present invention. For example, the T-shaped pins 152 may be drawn into their respective holes 180 by an electromagnetic or pneumatic force. Other possibilities also may be contemplated by those skilled in the art and are intended to fall within the scope of the present invention.

Figure 26:
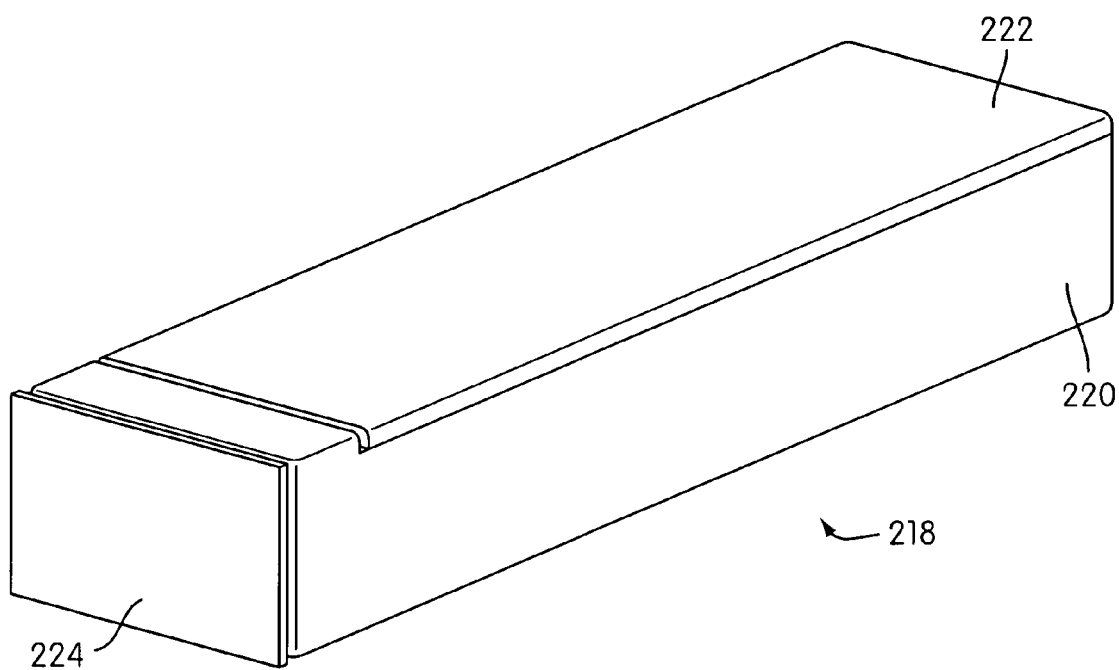
FIG. 26 is a perspective illustration of a laboratory/bench testing apparatus according to another embodiment of the present invention.

FIG. 26 illustrates another embodiment of the present invention. Specifically, one contemplated configuration for a laboratory tester or bench tester 218 is shown. The bench tester 218 is shown with a housing 220 having a removable cover 222. A DUT card 224 is located at one end of the bench tester 218 to provide a connection to the DUT 12. As would be appreciated by those skilled in the art, however, the DUT card 224 could be replaced with a standard connector such as a cable, a probe, one or more clips, etc.

Figure 27:
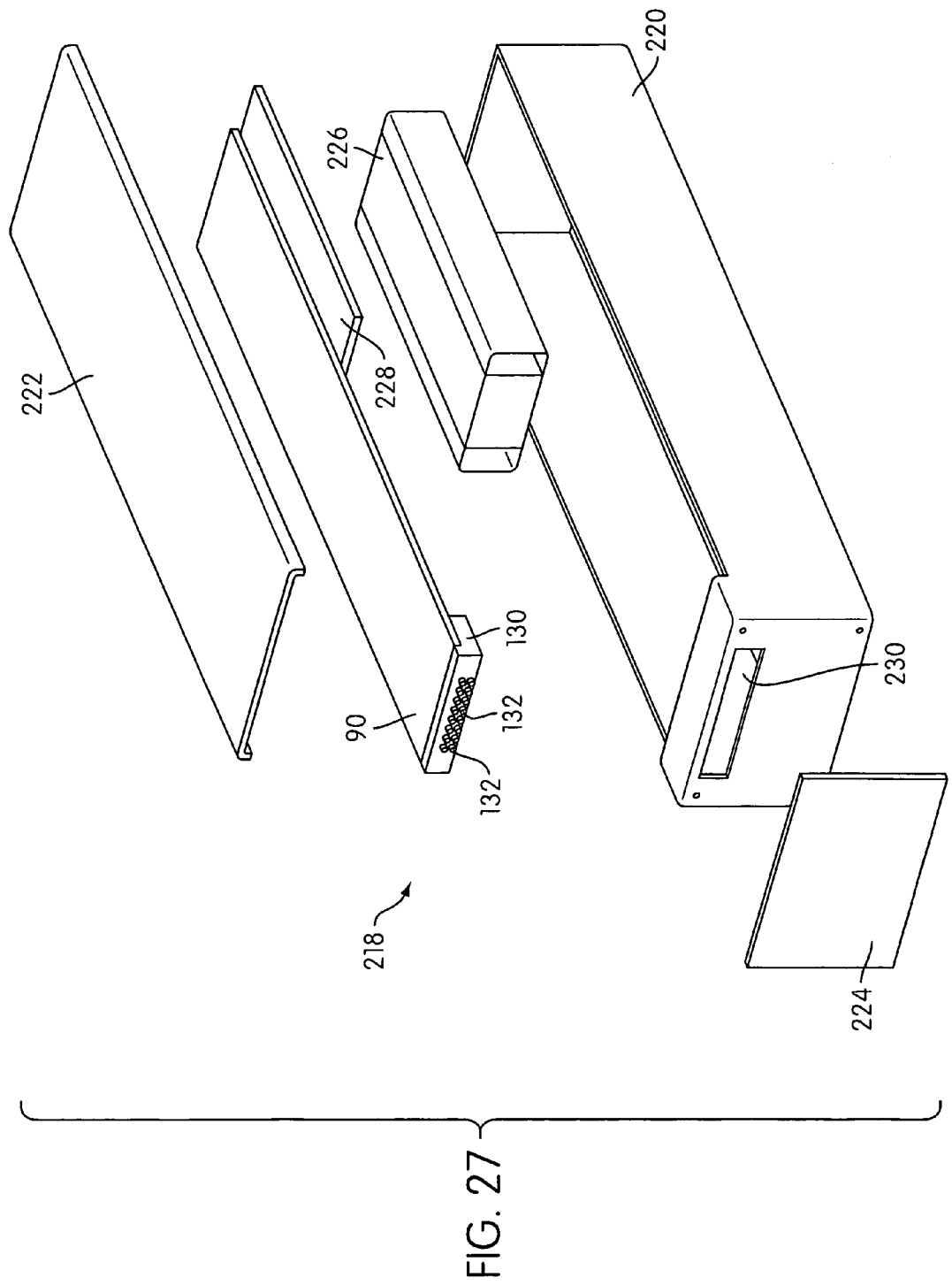
FIG. 27 is an exploded view of the laboratory/bench testing apparatus illustrated in FIG. 25.

FIG. 27 provides a perspective, exploded illustration of the bench tester 28 illustrated in FIG. 26. The housing 220, cover 222, and DUT card 224 are shown in this depiction. In addition, some the components contemplated to be included in the bench tester 218 also are illustrated. For example, the bench tester 218 preferably includes a power supply 226. The power supply 226 may be a wired power supply, meaning that it may be plugged into a wall outlet, or may be of a type that provides a battery so that the bench tester 218 may be used without being plugged into a wall outlet. It is preferred that the bench tester 218 be portable, but this is not required to practice this embodiment.

The bench tester 218 also includes an alternative carrier assembly 228 that connects the resource board 90 to the power supply 226. The alternative carrier assembly 228 preferably functions in a similar manner to the carrier assembly 98 described above. However, two features noticeably absent from the alternative carrier assembly 228 are the loadboard clamping mechanism head 174 and the T-shaped pins 152. The resource board 90 preferably functions in the same manner as the resource boards 90 described above. In fact, it is contemplated that one (or more) of the resource boards 90 described in connection with the testing apparatus 10 may be employed in the bench tester 218. As a result, the resource boards 90, being modular components, may be adapted both for use in the testing apparatus 10 or in the bench tester 218, among other embodiments that would be appreciated by those skilled in the art.

The top end of the resource board 90 preferably extends through the opening 230 at one end of the housing 220. As a result, the test pin assembly 130 is positioned such that the pins 132 may contact the DUT card 224, thereby permitting testing of the DUT 12.

Figure 28:
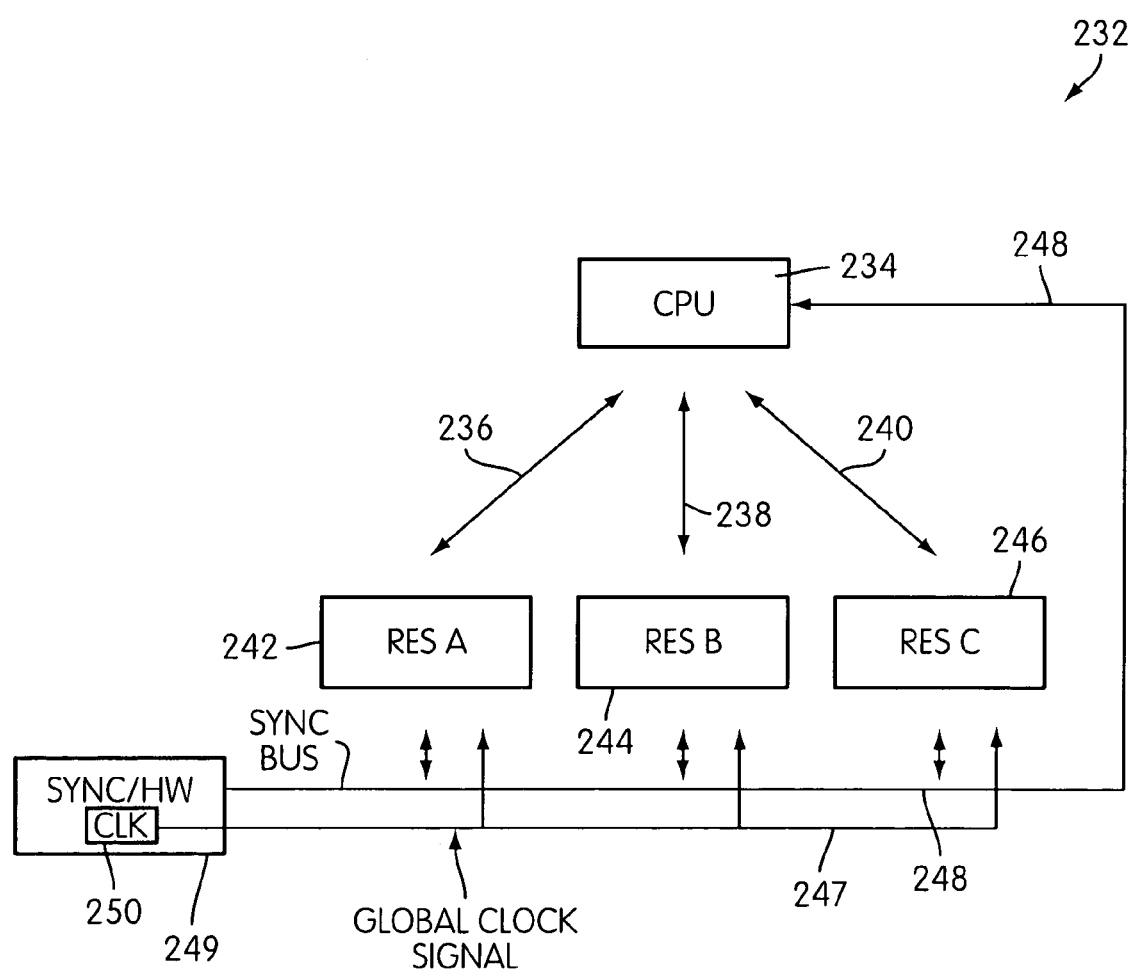
FIG. 28 is a diagram illustrating functional aspects of testing devices known in the prior art.

FIG. 28 is an architectural diagram of a portion of one prior art testing device 232. A CPU 234 provides instructions to various parts of the testing device 232 via communication links 236, 238, 240, among others. In particular, the CPU 234 communicates with the resource cards 242, 244, 246 through the communication links 236, 238, 240 and also via the synchronization bus 248, the synchronization hardware 249, and the clock 250. As depicted by FIG. 28, the clock 250 is a part, or a component, of the synchronization hardware 249. The synchronization bus 248 communicatively connects the CPU 234 to the resource cards 242, 244, 246 and the synchronization hardware 249 and the clock 250. A separate global clock signal line 247 connects the clock 250 to the resource cards 242, 244, 246.

The synchronization bus 248, synchronization hardware 249 and the clock 250 form at least a part of the prior art device known as the "backplane." The backplane encompasses hardware required to synchronize the various parts of the prior art testing device 232.

As discussed above, the backplane of the prior art testing device 232 is a differentiating plug to which the resource cards 242, 244, 246 connect. Since the backplane is a differentiating connector, resource card 242 may not be positioned in the slot into which resource card 244 is inserted, for example. Similarly, resource card 246 may not connect to the backplane at either of the locations dedicated to resource cards 242, 244. It is for this reason, at least in part, that the prior art testing device 232 is not considered to be adaptable. The resource cards 242, 244, 246 are not interchangeable in every instance.

One reason that the resource cards 242, 244, 246 are not interchangeable is because the prior art testing device 232 requires synchronization between the various operations performed by the resource cards 242, 244, 246. As shown in FIG. 28, the CPU 234 is connected to the synchronization hardware 249 and the clock 250 via the synchronization bus 248, among other connections. In operation, the CPU 234 provides operation of the synchronization hardware 249 and the clock 250 via the synchronization bus 248. The clock signals are transmitted to the resource cards 242, 244, 246 and the CPU 234 via the synchronization bus 248. A second reason resource cards are not interchangeable in prior art is due to the different voltage requirements for various resource cards require a backplane to route these voltages. The resource boards 90 of the present invention all require an identical voltage input from the backbone 96, and convert any specific voltages as required.

The synchronization bus 248 is responsible, at least in part, for coordinating the operations of the resource cards 242, 244, 246. The synchronization bus 248, which may be part of the "backplane," provides different connections to the resource cards 242, 244, 246, each of which may have different power requirements.

Before discussing the architectural design of the testing apparatus 10 of the present invention, one further observation is presented. Prior art testing devices 232 are large in size. One reason for the large size of these devices 232 is the inclusion of the synchronization hardware 249 and the backplane. Since the testing apparatus 10 of the present invention does not require synchronization hardware 249 and a synchronization bus 248, the testing apparatus 10 of the present invention may be made smaller and lighter in weight than prior art testing devices 232. In addition, as mentioned, testing apparatuses 10 constructed according to the present invention will be less costly to manufacture because they do not include at least the synchronization hardware 249 and the synchronization bus 248, both of which are needed for operation of the prior art testing device 232.

Figure 29:
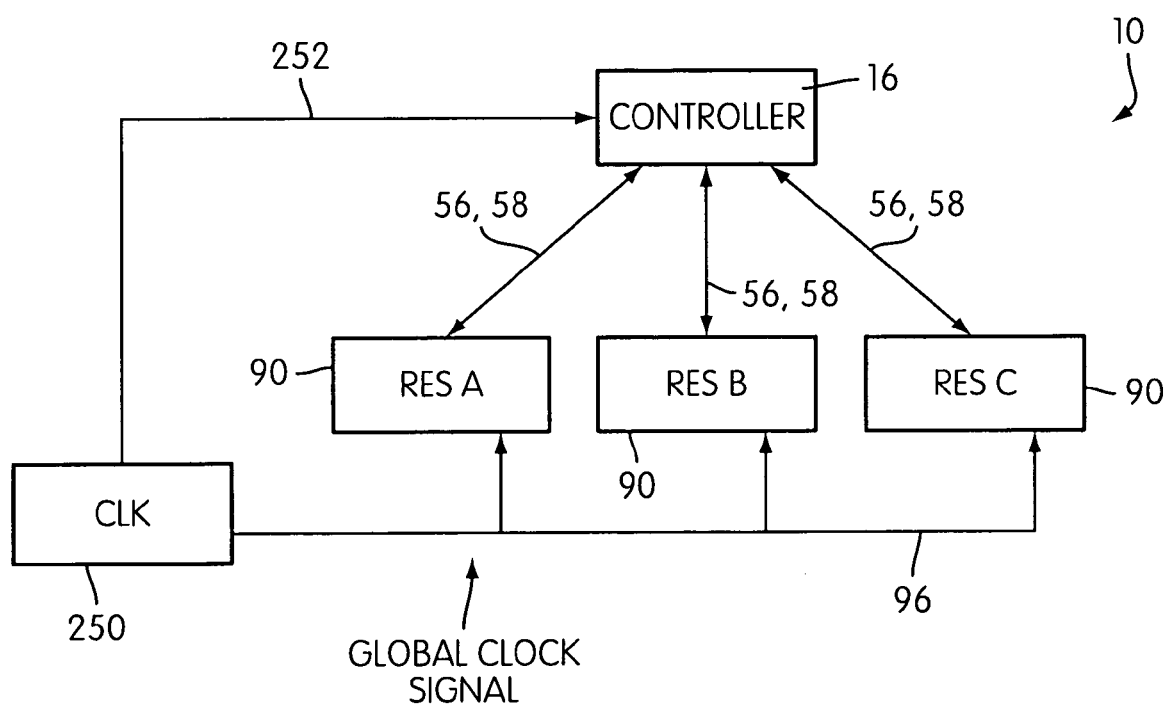
FIG. 29 is a diagram illustrating functional aspects of an embodiment of the apparatus of the present invention.

FIG. 29 provides an architectural overview of the construction of the testing apparatus 10 of the present invention. By contrast with the architectural diagram of the prior art testing device 232 shown in FIG. 28, there are two features that are noticeably absent. First, the testing apparatus 10 of the present invention does not require a synchronization bus 248. Second, the testing apparatus 10 does not require synchronization hardware 249. Without synchronization hardware 249 and a synchronization bus 248, the testing apparatus 10 of the present invention is significantly simplified in its design with respect to the testing device 232 known in the prior art.

By the architecture of the testing apparatus 10 of the present invention, the controller 16 communicates with the resource boards 90 connected thereto via the communication links 56, 58. A global clock signal is provided to the resource boards 90 via the backbone 96. In one embodiment of the testing apparatus 10 of the present invention, the global clock 254 is a clock generator that provides a 10 MHz signal to the backbone 96 continuously. Of course, any other type of signal may be provided to the backbone without departing from the scope of the present invention. As also illustrated in FIG. 29, the clock 250 provides the clock signal to the controller 16 via a clock signal line 252. The clock signal line 252 alternatively may be omitted, as would be appreciated by those skilled in the art.

In FIGS. 28 and 29, the clock 250 has been given the same reference number intentionally. In both the prior art testing device 232 and the testing apparatus 10 of the present invention illustrated, to facilitate an understanding of at least some of the aspects of the present invention the clock 250 is the same. Of course, as should be appreciated by those skilled in the art, the testing apparatus 10 may include a clock that differs from the clock 250 incorporated into the prior art testing device 232.

By the design of the testing apparatus 10 of the present invention, no signal needs to travel between the resource boards 90 and any synchronization hardware across any synchronization bus. For the testing apparatus 10 of the present invention, the global clock signal distributed along the backbone and the clock signal line 252 analogously acts as metronome for the resource boards 90 and the controller 16 to coordinate their functionality.

Figure 30:
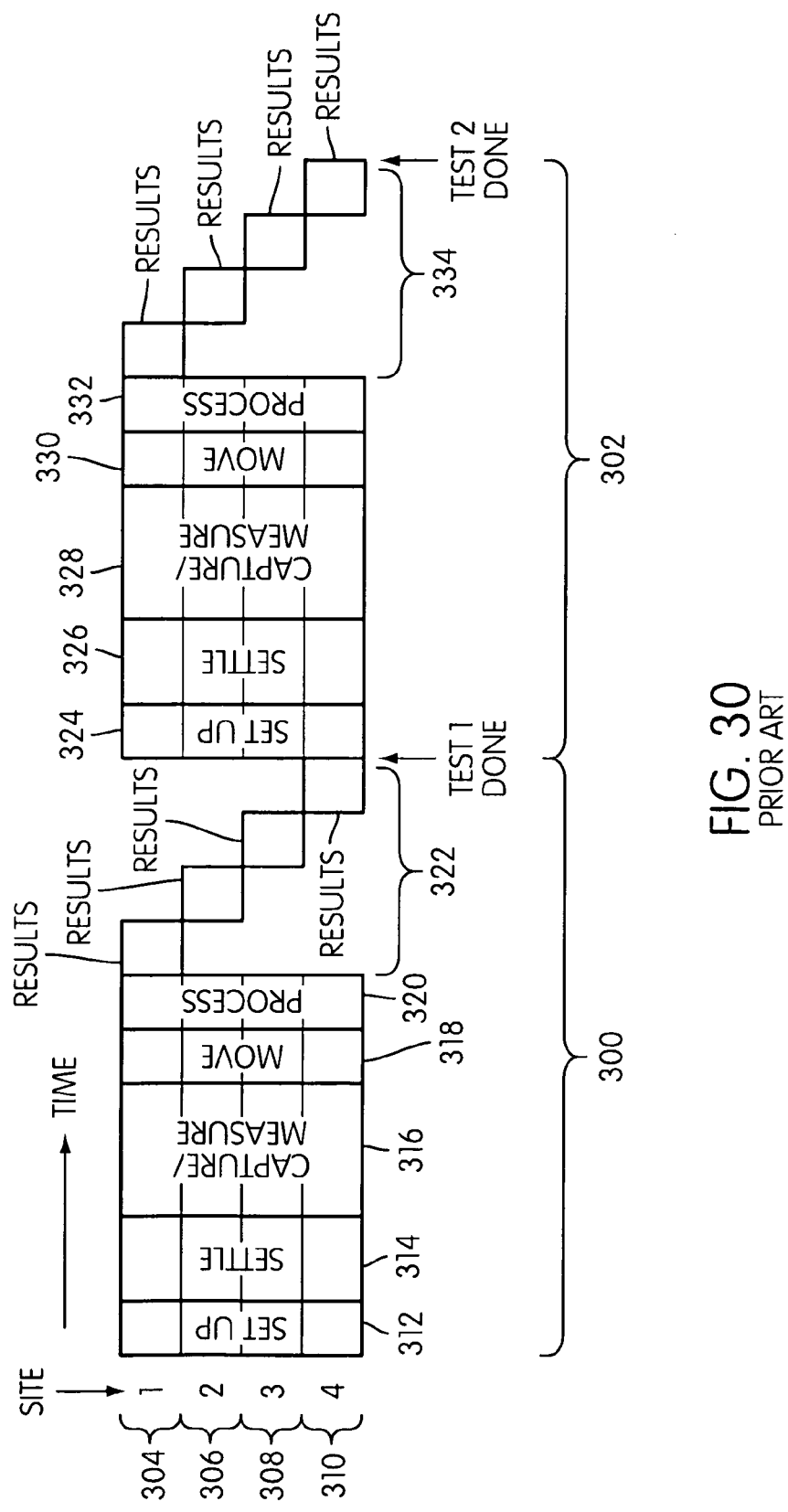
FIG. 30 illustrates one example of a portion of a testing sequence employed by testing devices known in the prior art.

FIG. 30 illustrates the manner in which prior art testing devices 232 operate. The discussion of FIG. 30 is not intended to describe every prior art device or every permutation in the operation of every prior art testing device 232. FIG. 30 merely provides an overview of a portion of one method of operation to facilitate an understanding of some of the features offered by the present invention. Comparatively, a portion of one method of operation contemplated for the testing apparatus 10 of the present invention is illustrated in FIG. 31.

Figure 31:
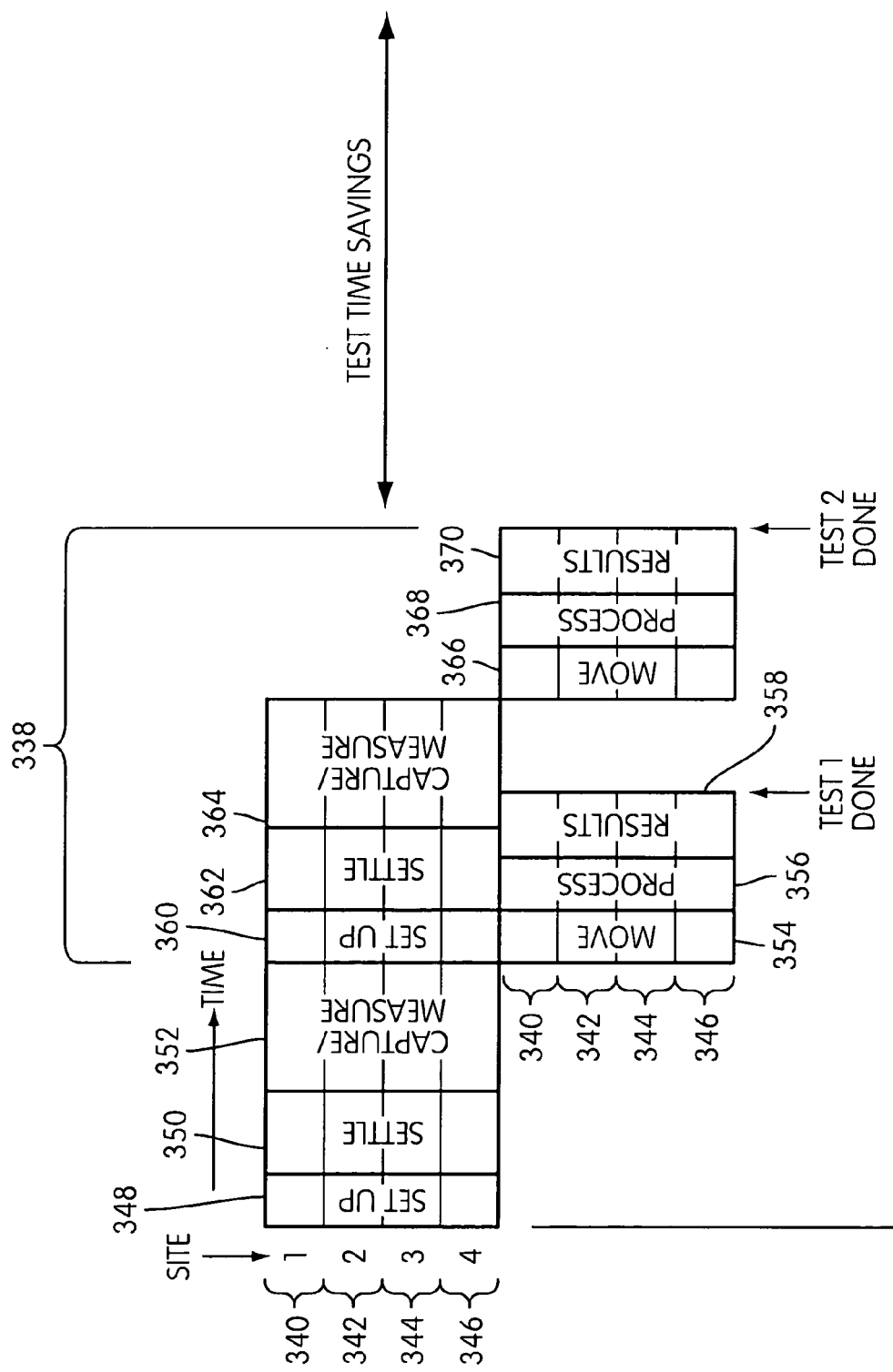
FIG. 31 illustrates one example of a portion of testing sequence contemplated by the present invention.

As should be appreciated by those skilled in the art, the juxtaposition of the method steps in FIGS. 30 and 31 are not intended to encompass every contemplated methodology encompassed by the present invention. FIGS. 30 and 31 are intended to provide one comparative example so that the scope of the present invention may be appreciated by those skilled in the art. Variations will become apparent to those skilled in the art and are intended to be encompassed by the present invention.

With reference to FIG. 30, it is noted that the different tests are performed by the prior art testing device 232 are coordinated by signals from the synchronization hardware 249 traveling through the synchronization bus 248. The testing methodology of prior art testing devices 232 permits parallel processing of plural DUTs at the same time.

In FIG. 30, the prior art testing device 232 performs a number of tests on the DUT, of which tests 300, 302 are two consecutive steps in the test sequence. In order to process as many DUTs as possible, the prior art testing device 232 may be designed with multiple testing sites. For purposes of this discussion, only four testing sites 304, 306, 308, 310 are shown and described. In this example, the loadboard accepts four DUTs. As should be appreciated by those skilled in the art, however, the loadboard may accept a greater number of DUTs than four, but this number has been selected for simplicity of this discussion. As indicated above, the CPU 234 coordinates the operation of the two tests 300, 302 and may process the data generated by the two tests 300, 302 (among the other tests that make up the test sequence).

The first test 300 and the second test 302 are intended to be adjacent tests generic to a particular testing sequence. Discussion of the first test 300 and the second test 302 are not intended to imply that the test sequence includes only two tests. To the contrary, the first test 300 and the second test 302 may be two adjacent tests in the middle of a test sequence including hundreds of tests, for example.

The first test 300 begins with an initial setup step 312, which is performed after the DUTs are brought into contact with the loadboard. The initial setup step 312 is expected to be specific for the test 300 to be performed. For example, the setup step 312 may involve applying power to the DUT or applying a particular temperature to the DUT, among others. After the initial setup step 312, there is a time during which the DUTs are permitted to settle. The settle step 314 encompasses a period of time where, for example, electrical signals to and from the DUTs are permitted to stabilize before the remaining steps proceed. After the settle step 314, the device measures parameters of the DUTs or sends signals to the DUTs and measures (or captures) outputs from the DUTs in a capture/measure step 316. The data that has been captured or measured is then moved, possibly to the CPU 234, in a move step 318. Alternatively, the data may be moved to a memory cache or a processor located physically on one of the resource card 242, 244, 246 responsible for this particular test. The resource card 242, 244, 246 or the CPU 234 will then process the data received from the DUTs, in a process step 320, to create test results 322. At this point, the first test 300 is completed. As would be understood by those skilled in the art, one or more of the resource cards 242, 244, 246 may be involved in both the first test 300 and the second test 302 in addition to other tests.

The test sequence then proceeds to the second test 302. In this regard, it is noted that the DUTs remain on the loadboard and remain in contact with the prior art testing device 232.

In the example shown in FIG. 30, for the sake of simplicity, the second test 302 follows the same sequence of test steps as the first test 300. The testing device 232 is initialized in a setup step 324. Then, the DUTs are permitted to settle in a settle step 326. After settling, a capture/measure step 328 is performed. That step results in the generation of data. After the capture/measure step 328, the generated data is moved in a move step 330. One or more of the resource cards 242, 244, 246 and/or the CPU 234 will then process the generated data in a process step 332 to produce results 334.

At the conclusion of the test, the test results may be evaluated by the CPU 234 to determine if the DUTs have passed or not. If the DUTs pass the tests, the DUTs are processed further. Further processing may mean that the DUTs are subjected to additional tests in the test sequence. If the DUTs do not pass one or more of the tests that make up the test sequence, then they may be sent to a discard or possibly a reprocessing bin as rejects.

As may be appreciated from FIG. 30 and as would be appreciated by those skilled in the art, the entire testing procedure encompassing the two tests 300, 302 requires a certain amount of time. However, that amount of time is not fixed. Each time the test sequence is performed with the testing device 232 in the prior art, the total test time is likely to differ from a previous run. One reason for this is the requirement for synchronization. In order for the tests in the test sequence to be performed in the appropriate manner, the synchronization hardware 249 waits until aspects of the test sequence meet predetermined parameters. As a result, while the test sequence may not be altered between runs, there is no certainty that the test sequence will take the same amount of time each time the test sequence is executed. Variations in wait time will lengthen or shorten the total test time by comparison with a previous run. This variability presents a difficulty for the manufacturer because the total test sequence time cannot be predicted when the test sequence is initiated.

The method of the present invention does not rely on the synchronized approach to testing as discussed in connection with FIG. 30. Instead, the testing method of the present invention offers a pipelined processing approach, the details of which are discussed below. The term pipelined processing has been selected to describe the method of the present invention and distinguish the present invention from the synchronized, non-pipelined approach to testing practiced by the prior art.

Before beginning this discussion, it is noted that the results of tests of the DUTs, whether performed by the prior art testing device 232 or the testing apparatus 10 of the present invention are intended to be the same. In other words, while the method and apparatus of the present invention differ from the prior art, the results obtained from the two methods and devices do not.

One way to conceptualize the advances offered by the present invention is to discuss the present invention in the context of a musical symphony. In prior art, the synchronization hardware 249 is viewed as a "conductor" of the symphony. In order for the symphony to be understood, the various instruments (i.e., the resource cards 242, 244, 246) must execute the test steps 312-334 in a particular sequence and must follow a particular timing. This is the synchronization aspect of the prior art.

In the method of the present invention, without synchronization hardware 249 and the synchronization bus 248, there is no "conductor." Instead, following the analogy, the controller 16 initiates the steps or functions to be performed by the resource boards 90 according to the clock signal. Many of the different instruments (i.e., the resource boards 90) in the orchestra (i.e., the testing apparatus 10) play simultaneously and, in time with the clock signal, know when to play at the exact determined time set by the programming for the testing apparatus 10.

FIG. 31 presents a simplified view of one contemplated sequence for a portion of the method of operation of the testing apparatus 10 of the present invention. The steps selected for FIG. 31 intentionally are the same as the individual steps selected for the two tests 300, 302 illustrated in FIG. 30. Moreover, at least for purposes of this discussion, the time required to perform each test step is intended to be the same as with each test step in the prior art.

While the steps illustrated in FIG. 31 may have the same appellations, they are intentionally labeled with different reference numerals because the individual steps may, in fact, differ by taking advantage of the capabilities offered by the testing apparatus 10 of the present invention. In one example, it is believed that one or more of the steps performed by the testing apparatus 10 of the present invention may require less time than the equivalent step performed by a prior art testing device 232. In addition, the modular construction of the testing apparatus 10 of the present invention permits some of the individual steps that make up the test sequence to be redesigned by comparison with equivalent steps performed by prior art methods. For example, the capture/measure step 352 of the present invention may not be directly comparable with the capture/measure step 316 in the prior art because the capture/measure step 352 may include portions of the settle step 314 from the prior art.

As illustrated in FIG. 31, the first test 336 and the second test 338 refer to adjacent steps in a test sequence that may include hundreds of tests, just an in FIG. 30. Both of the tests are performed at four sites 340, 342, 344, 346, just as in the test illustrated in FIG. 30. As would be appreciated by those skilled in the art, the test sequence may be performed at any number of test sites, of which sites 340, 342, 344, 346 are but four examples. In addition, as with the prior art example, the first test 336 and the second test 338 may be adjacent tests in the middle of the test sequence.

The first test 336 includes the following series of steps: (1) a setup step 348, (2) a settle step 350, (3) a capture/measure step 352, (4) a data move step 354, (5) a process step 356, (6) and a results step 358. The second test 338 includes the following steps: (1) a setup step 360, (2) a settle step 362, (3) a capture/measure step 364, (4) a data move step 366, (5) a process step 368, and (6) a results step 370.

As FIG. 31 makes clear, the steps 348-370 for the tests 336, 338 do not follow the non-pipelined approach as do the steps 312-334 for the tests 300, 302. In this example, there are a few noteworthy differences. The tests 336, 338 at least partially overlap one another. The move step 354 of the first test 336 is performed concurrently with the setup step 360 of the test 338. The process step 356 of the first test 336 is performed at the same time as the settle step 362 of the second test 338. In addition, the results step 358 of the first test 336 overlaps both the settle steps 362 and the capture/measure steps 364 of the second test 338. In addition, the results steps 358, 370 are performed at the same time for each of the sites 340-346. As would be appreciated by those skilled in the art, there is no theoretical limit to the number of stages that may be pipelined, and n stages may be pipelined simultaneously.

As FIGS. 30 and 31 illustrate, the methodology of the present invention provides a time saving by comparison with the method of the prior art.

Many of the steps in the test sequence performed by the testing apparatus 10 of the present invention will take the same amount of time as the equivalent step in the prior art. The time savings offered by the present invention are realized by the elimination of the delays associated with the elimination of the synchronization hardware 249 and the synchronization bus 248 and by the application of a pipelined approach to testing.

To assist with an understanding of the present invention, the following example is provided. Assume that the capture/ measure step 316 takes 500 ms to complete. Assume also that the processing step 320 requires 500 ms to complete. Combined, the two steps require 1 sec to complete in the non-pipelined approach to testing.

Following the pipelined methodology of the present invention, assume that the capture measure step 352 requires 500 ms to complete. Assume also that the processing step 356 requires 500 ms to complete. Because the present invention relies on a pipelined approach to testing, the total time required to complete the two steps is 500 ms, resulting in a savings of 500 ms associated with the processing time.

It is recognized that a designer of a prior art test sequence may manipulate the capture/measure step 316 so that the step requires less time, e.g., 400 ms. However, by reducing the time required for the capture/measure step 316, the time required for the processing step 320 may increase to, e.g., 800 ms. Therefore, by altering the duration of one step, the total processing time has increased to 1200 ms, which is 200 ms longer than the unmodified example. Accordingly, the design of a test in the prior art necessarily takes into account a balance between the time requirements of the individual steps that make up the test, and the total time required to complete the test sequence reflects this balance.

Turning now to the present invention, if the same modification were to be made to the capture/measure step 352, that step would require 400 ms to complete. If the same modifications were to be made to the processing step 356, that step would expand to 800 ms. However, because the test sequence is pipelined, it is possible to incorporate additional processors into the testing apparatus 10 to reduce the processing step 356 to 400 ms. As a result, the total time required for both steps may be reduced to 400 ms.

One aspect of the pipelined approach of the present invention is made apparent by the foregoing example. The pipelined approach permits different steps to be modified independently from one another. A test sequence designer, therefore, has greater control over the throughput of a particular testing apparatus. While the test time may remain the same, the throughput may be increased.

Figure 32:
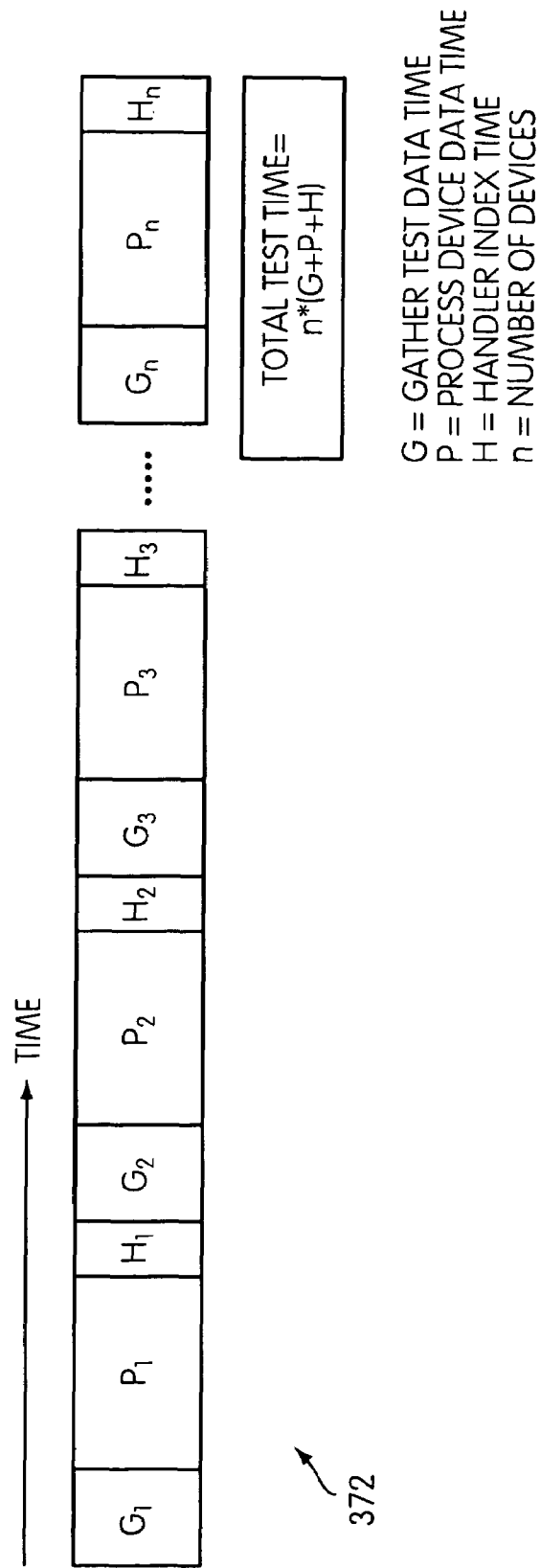
FIG. 32 illustrates one example of a timeline for a plurality of testing sequences practiced by the prior art.
Figure 33:
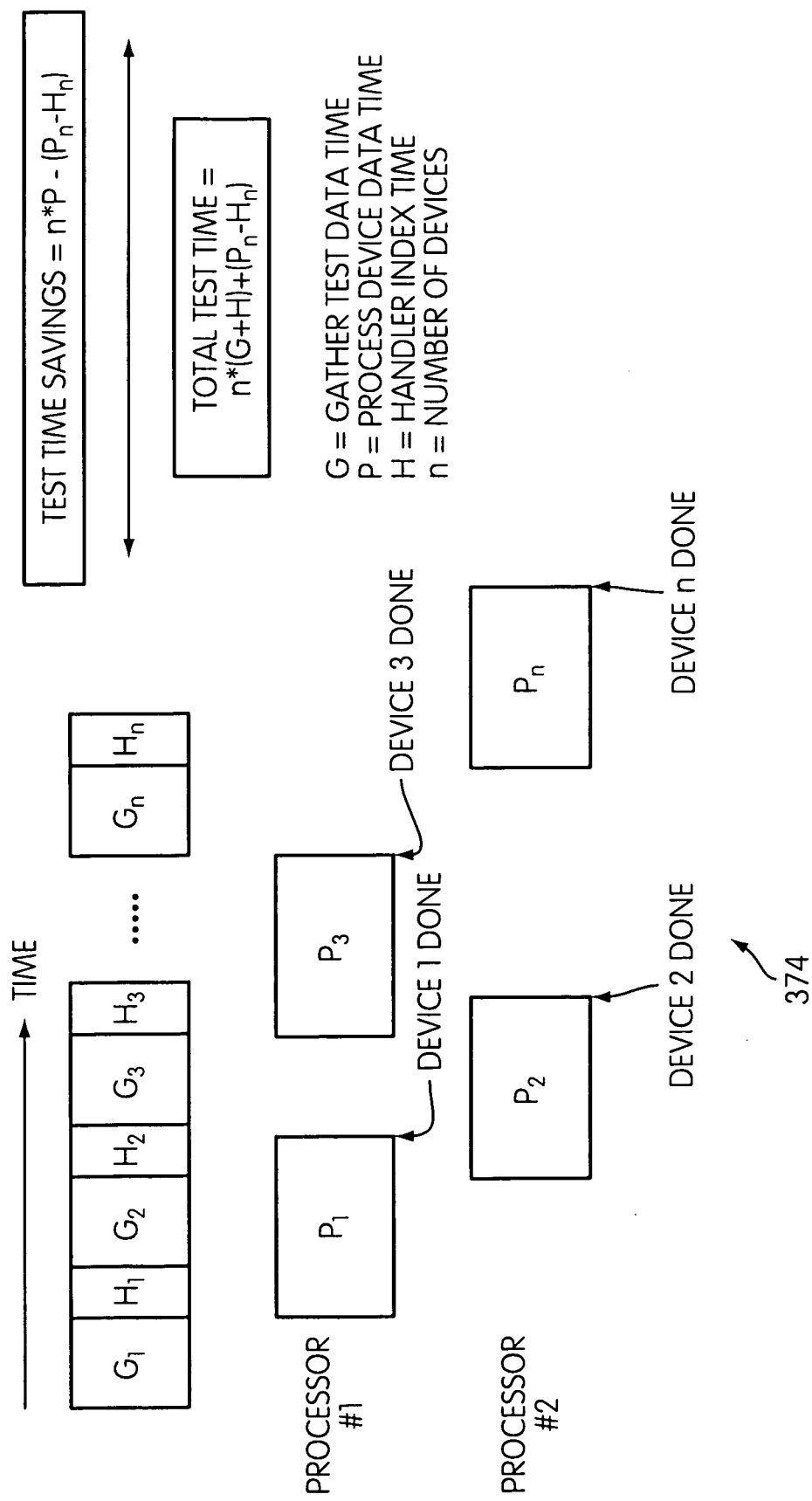
FIG. 33 illustrates one example of a timeline for a plurality of testing sequences practiced by the present invention.

Another way to appreciate the advantages of the method of the present invention is illustrated by FIGS. 32 and 33. FIGS. 30 and 31 illustrate portions of test sequences. FIGS. 32 and 33, by comparison, illustrate entire test sequences, focusing on the handler and prober aspects thereof.

FIG. 32 illustrates one example of a test sequence employed by the prior art testing device 232. The timeline shows the sequence of gather test data time periods $G_n$, process device data time periods $P_n$, and handler index time periods $H_n$, where n is the number of DUTs tested. The total test time for the testing of the DUTs therefore, is the sum of the gather test data time periods G, process device data time periods P, and handler index time periods H for each of the DUTs. The following equation provides a summary of the total test time period required to practice the prior art method with the prior art testing device 232:

$$\text{Total Test Time} = \sum_{l}^{n} (G_n + P_n + H_n)$$

FIG. 33 provides a summary of the timeline for the method according to the present invention. FIG. 33 illustrates a timeline 374 showing the sequence of gather test data time periods $G_n$, process device data time periods $P_n$, and handler index time periods $H_n$, where n is the number of DUTs tested. According to the method of the present invention, since the process device time periods are offset from subsequent gather test time periods and handler index time periods, except for the processing time for the last (or $n^{th}$) DUT, the total test time for the testing of all of the DUTs follows the equation:

$$\text{Total Test Time} = \left[\sum_{l}^{n} (G_n + H_n)\right] + (P_n - H_n)$$

In other words, the total test time required for the method of the present invention is the sum of all of the gather and handling times plus the portion of the $n^{th}$ processing time for the $n^{th}$ DUT that extends past the $n^{th}$ handling time $H_n$.

As set forth in FIG. 33, the total test time savings for the method of the present invention is represented by the equation:

$$\text{Total Test Time Savings} = \left[\sum_{l}^{n} P_n\right] - (P_n - H_n)$$

In other words, the total time savings includes the time saved by the pipelined processing time periods, except for the processing time period $P_n$ extending past the handling time, $H_n$, associated with the last DUT. As may be appreciated by those skilled in the art, this is a significant time savings by comparison with the method practices by testing devices 232 in the prior art.

Additional aspects of the present invention will now be discussed.

One aspect of the present invention relies upon the elimination of synchronizing hardware 249 and the synchronization bus 248 from the testing apparatus 10. Instead, the carrier assemblies 98 and the resource boards 90 rely upon a packet-switching communication protocol to communicate with each other and with the controller 16. Without the synchronizing hardware 249, the synchronization bus 248, and the synchronizing signals and delays generated therewith, each carrier assembly 98 and each resource board 90 preferably contains a counter that is a function of the clock signal generated by the global clock 250. The counter keeps track of the current time relative to an initial synchronization time. It is by taking advantage of this methodology that deterministic testing algorithms according to the method of the present invention are made possible.

In connection with the clock 250, it is noted that synchronization does occur in the testing apparatus 10, system 14, and method of the present invention. However, having eliminated the synchronization hardware 249 and the synchronization bus 248 and by keeping a simple clock signal, synchronization between the resource boards 90 is greatly simplified. The clock 250 and counters within each of the resource boards 90 function, at least in part, to synchronize the operation of the resource boards 90 in the testing apparatus.

Another aspect of the testing apparatus 10 of the present invention involves communication routing for each resource board 90. Specifically, communication routing for each resource board 90 has been standardized, thereby enabling logical and physical interchangeability between functional resource boards 90. This aspect was discussed above at least in connection with the carrier assembly connectors 148.

The standardization of communication routing not only facilitates interchangeability of the resource boards 90, but it also provides for limitless configurability of the testing apparatus 10. Configurability may be manipulated on at least two levels. First, a particular carrier assembly 98 may be configured to contain any number and types of resource boards 90. Second, the testing apparatus 10 may be configured through selection of the number and location of different carrier assemblies 98.

There are many advantages to so versatile an architecture. The following summary discusses a few of the advantages. This discussion is not meant to be exhaustive of all of the advantages offered by the present invention and others will be appreciated by those skilled in the art.

First, the user may configure the testing apparatus 10 specifically to the testing requirements at hand. This includes adapting the testing apparatus 10 even on a small incremental level. As discussed above, each of the resource boards 90 include eight test pins 132. Not all of the test pins 132 need to be used. Accordingly, the testing apparatus 10 of the present invention may be configured on a microscopic level by selecting only those of the test pins 132 that are required for use by a particular resource board 10. This allows a tester to be optimized to the DUTs 12 to be tested without requiring the purchase of extra hardware that becomes unused. As a result, test costs may be minimized.

Second, the testing apparatus 10 may be reconfigured easily if there is any change to the design or type of DUT 12 being tested. Among other reasons, the granularity of the resource boards 90 facilitates reconfiguration of the testing apparatus 10. This is of particular interest to Contract Testing Companies where there is no control over the types of devices being designed or tested because these companies have so many different customers with different needs.

Third, as new technologies emerge, the ease of developing or changing the design of the resource board 90 is minimal. For example, resource boards 90 may be quickly replaced with upgraded resource boards. This further reduces the cost of the testing apparatus 10 as there is less non-recurring engineering cost required to develop hardware and software for each resource board 90.

Fourth, the ability to create a custom resource board 90 for a specific application is simplified. This may reduce the time and cost required to develop and integrate a new resource board 90 into an existing testing apparatus 10, for example.

Fifth, the spare parts required for the testing apparatus 10 are minimized and are therefore less costly to the user. This is due, at least in part, to the smaller size of the resource boards 90 and the fact that the overall hardware itself has been minimized.

Sixth, the reliability of the testing apparatus 10 is enhanced, as there are fewer parts required in the testing apparatus 10 to perform a specific test application. As would be appreciated by those skilled in the art, there is a direct correlation between higher reliability and the lower number of parts or devices in any given design.

As indicated above, it is noted that prior art testing devices use synchronizing signals to control the timing of available resources. Current, state-of-the-art testing devices have several test boards (e.g., digital, analog, RF, etc.). Each of these test boards typically contains test instructions thereon and are ready, at any moment, to execute those test instructions. So configured, these test boards may execute their embedded instructions without any inter-resource signals. However, to synchronize the test instructions between resources, complex synchronizing hardware 249, a synchronization bus 248, and complex methodologies are needed. The synchronization hardware 249, the synchronization bus 248, and the synchronization instructions are costly and consume valuable processing time.

In contrast to this methodology, the testing apparatus 10 of the present invention relies upon deterministic timing to start and control available resources. The resource boards 90 execute their instructions in cooperation with the global clock signal. Without the need for synchronizing signals and the hardware to support the transmission of such signals, the testing apparatus 10 of the present invention is greatly simplified in its design by comparison with prior art testing devices.

For the testing apparatus 10 of the present invention, it is contemplated that the controller 16 will send an absolute time command to all of the resource boards 90. In response to the absolute time command and as a function of the clock signal, the resource boards 90 will execute the test instructions associated with the particular resource board 90. Data will be generated and will flow from the resource boards 90 back to the controller 16 at determined times. Since the control methodology is deterministic, no querying or interrupt mechanisms are needed.

Some of the benefits of designing the testing apparatus 10 with this capability are: (1) a reduction in test time (because the tests no longer require synchronization commands); (2) a reduction of synchronization circuitry that results in a lesser requirement for hardware (this results in a lower cost and permits the testing apparatus 10 to be made smaller than prior art testing devices); (3) a reduction of the number of interconnections within the tester (which is a direct result of the elimination of the backplane from the prior art testing device); (4) computer bus traffic may be minimized, which reduces the number of communication data packets that must be sent during the duration of a particular test; and (5) an increased reliability of the testing apparatus due to fewer parts (and, therefore, less likelihood of failure or shutdown, for example).

In addition, the deterministic operation of the testing apparatus 10 ensures that datalogging has a minimal impact on the timing needed to test a DUT 12, which is critical for test integrity. Datalogging refers to the storage of test information concerning the DUT 12.

In the prior art testing device, datalogging may present a difficulty with respect to the test sequence. When datalogging is enabled, a delay occurs in the testing sequence while the testing device waits for the data to be stored. Delays can cause any number of difficulties depending on the tests that are performed. For example, certain tests require an increase in the temperature of the DUT 12 for testing. A datalogging delay may allow the DUT 12 to cool down more than it would without the datalogging delay. Not only may this negatively impact the test results, but this may make it difficult for a test engineer to diagnose a problem with the test. Simply, the problem might change or go away depending on the length of the datalogging delay.

The testing apparatus 10 of the present invention avoids these types of situations. With respect to the testing apparatus 10 of the present invention, datalogging has no impact on the test sequence. One reason for this is that the test apparatus 10 of the present invention is designed specifically for datalogging.

It is noted that datalogging may require an amount of time as a part of the pipelined test sequence. However, at least partially because of the pipelined approach, dataloging has no impact on the total time required for the test sequence.

Pipelining allows the testing apparatus 10 to process data from one test or DUT 12 while gathering data for the next test or DUT 12.

On prior art testing devices 232, datalogging increases the amount of time between tests, between parts of a test, or between DUTs 12. Thus, it may be necessary to disable the datalogging function in prior art testing devices to realize more rapid performance. The downside to disabling datalogging is that the manufacturer typically wants the data that datalogging provides. This results in an uneasy situation where manufacturers are forced to choose between more rapid performance or more data. Other prior art testers assume that manufacturers need datalogging primarily to characterize devices and diagnose problems. However, many manufacturers would like datalog information even for production testing of mature devices.

The testing apparatus 10 of the present invention relies on multiple processors, in one embodiment, to enable pipelining of data processed by the controller 16. The testing apparatus 10 assigns a processor (from the multiple processors) to process the results of a particular test and another processor to process of the data from a subsequent test. The number of processors available may act as an upper limit to the maximum amount of parallel processing that one controller 16 may perform. The testing apparatus 10 of the present invention supports the use of multiple CPUs (or even multiple controllers 16) to achieve additional parallel processing.

The operation of the testing apparatus 10 of the present invention is scalable. In other words, adding more processors increases the performance of the testing apparatus 10 and the method employed thereby. The design of the testing apparatus 10 ensures that processing of data occurs concurrently with gathering of data from subsequent tests. This applies to processing data for a test while gathering data for the next test. This also applies to processing data for a device while gathering data for the next device. This type of pipelining may have more than one pipeline stage.

In the context of pipelining, one additional aspect of the present invention deserves mention. Specifically, pipelining, as utilized by the present invention may necessitate changes in the design of the handler 42 by comparison with the prior art. In the prior art, the handler moves the DUTs from the test head only after the data from the DUTs has been processed. As discussed, this is one drawback associated with the prior art. With respect to the handler 42 incorporated into the system 14 of the present invention, since processing is pipelined with respect to handling and processing, it is possible that the DUTs may need to be held for a period of time before the results of the test sequence are returned. In such an instance, it may be necessary to modify the prior art handler to store DUTs awaiting the results of the test sequence (including possibly a "pass" or "fail" result).

The foregoing discussion illustrates a mere fraction of the possible embodiments contemplated by the present invention. As would be appreciated by those skilled in the art, other embodiments are contemplated to fall within the scope of the invention, as defined in part by the claims appended hereto.

What is claimed is:

1. A testing apparatus, comprising:
   a housing;
   a power source;
   a carrier assembly disposed within the housing;
   a backbone distributing power from the power source to the carrier assembly and distributing a clock signal to the carrier assembly;
   a resource board disposed on the carrier assembly and connected thereto via a carrier board connection, wherein the resource board is adapted to perform at least a portion of a test by at least one of supplying signals to and receiving signals from a device under test, thereby generating test results;
   a test pin assembly operatively connecting the resource board to a loadboard, which is connectable to the device under test; and
   a controller in communication with the resource board, wherein controller is adapted to execute instructions to test the device under test and to return an analysis of the device under test using the test results.

2. The testing apparatus of claim 1, wherein the controller is adapted to execute instructions to test the device under test and return an analysis of the device under test using the test results without reliance on synchronization hardware.

3. The testing apparatus of claim 1, wherein the test pin assembly is disposed at one end of the resource board.

4. The testing apparatus of claim 1, wherein the carrier assembly comprises a plurality of carrier assemblies disposed within the housing.

5. The testing apparatus of claim 4, wherein the plurality of carrier assemblies are disposed in a side-by-side arrangement.

6. The testing apparatus of claim 4, wherein the resource board comprises a plurality of resource boards connected to each of a plurality of carrier assemblies.

7. The testing apparatus of claim 1, wherein the resource board comprises a plurality of resource boards disposed on the carrier assembly.

8. The testing apparatus of claim 7, wherein up to eight resource boards are connected to the carrier assembly.

9. The testing apparatus of claim 8, wherein eight resource boards are connected to the carrier assembly.

10. The testing apparatus of claim 9, wherein the carrier assembly comprises first and second sides and four resource boards are arrangeable adjacent to each of the first and second sides in a side-by-side arrangement.

11. The testing apparatus of claim 1, wherein the resource board is a circuit board being substantially two and one half inches in width and substantially twelve inches in length.

12. The testing apparatus of claim 1, wherein the test pin assembly comprises a plurality of test pins, each of which are connectable to the loadboard.

13. The testing apparatus of claim 12, wherein the plurality of test pins comprise eight test pins.

14. The testing apparatus of claim 13, wherein the eight test pins are arranged in a 2×4 arrangement.

15. The testing apparatus of claim 1, wherein the carrier assembly comprises eight resource boards and each resource board comprises eight test pins, thereby resulting in a 64-pin arrangement for the testing apparatus.

16. The testing apparatus of claim 1, wherein the carrier assembly comprises two carrier assemblies, each carrier assembly comprises eight resource boards, and each resource board comprises eight pins, thereby resulting in a 128-pin arrangement for the testing apparatus.

17. The testing apparatus of claim 1, wherein the carrier assembly comprises four carrier assemblies, wherein each carrier assembly comprises eight resource boards and each resource board comprises eight pins, thereby resulting in a 256-pin arrangement for the testing apparatus.

18. The testing apparatus of claim 1, wherein the carrier assembly comprises first and second sides disposed a predetermined distance from one another, thereby defining a gap therebetween.

19. The testing apparatus of claim 18, wherein cooling is provided via the gap to cool the resource board disposed adjacent thereto.

20. The testing apparatus of claim 19, wherein cooling is provided by circulating air between the first and second sides of the carrier assembly.

21. The testing apparatus of claim 19, wherein cooling is provided by circulating fluid between the first and second sides of the carrier assembly.

22. The testing apparatus of claim 1, wherein the carrier assembly further comprises a clamping mechanism for releasably connecting the loadboard to the test pins.

23. The testing apparatus of claim 22, wherein the clamping mechanism is disposed near a top end of the carrier assembly.

24. The testing apparatus of claim 23, wherein the clamping mechanism comprises:
- a camshaft disposed between the first and second sides of the carrier assembly, the camshaft defining a cam therealong, wherein an axis of the cam is offset radially from an axis of the camshaft;
- a T-shaped pin disposed substantially orthogonally to the cam, wherein a top end of the T-shaped pin presents a T-shaped cross-section and is protrudable from a top surface of the clamping mechanism and wherein a bottom end of the T-shaped pin abuts against the cam;
- a spring disposed between the clamping mechanism and the bottom end of the T-shaped pin, wherein the spring biases the T-shaped pin such that the bottom end of the T-shaped pin is biased against the cam; and
- a knob defined by an end of the camshaft, wherein, when the knob is rotated, the camshaft rotates, causing the top end of the T-shaped pin to extend from the top surface of the clamping mechanism and to retract toward the top surface of the clamping mechanism.

25. The testing apparatus of claim 24, wherein the clamping mechanism comprises:
- five cams disposed on the camshaft;
- five T-shaped pins abutted against the cams; and
- five springs disposed between the clamping mechanism and the bottom ends of the T-shaped pins,
- wherein when the knob is rotated, the five T-shaped pins move in unison with the cams.

26. The testing apparatus of claim 24, wherein the loadboard defines an eyelet hole that releasably engages the top end of the T-shaped pin so that, when the T-shaped pin retracts toward the top surface of the clamping mechanism, the top end of the T-shaped pin draws the loadboard onto the test pins.

27. A clamping mechanism for releasably securing a loadboard to at least one test pin associated with a testing apparatus, the clamping mechanism comprising:
- a clamping mechanism head;
- a camshaft disposed within the clamping mechanism head, the camshaft defining a cam therealong, wherein an axis of the cam is offset radially from an axis of the camshaft;
- a T-shaped pin disposed substantially orthogonally to the cam, wherein a top end of the T-shaped pin presents a T-shaped cross-section and is protrudable from a top surface of the clamping mechanism head and wherein a bottom end of the T-shaped pin abuts against the cam;
- a spring disposed between the clamping mechanism head and the bottom end of the T-shaped pin, wherein the spring biases the T-shaped pin such that the bottom end of the T-shaped pin is biased against the cam; and
- a knob defined by an end of the camshaft, wherein, when the knob is rotated, the camshaft rotates, causing the top end of the T-shaped pin to extend from the top surface of the clamping mechanism head and to retract toward the top surface of the loadboard clamping mechanism head.

28. The clamping mechanism of claim 27, wherein the camshaft is disposed near a top end of the testing apparatus.

29. The clamping mechanism of claim 27, further comprising:
- a plurality of cams disposed on the camshaft;
- a plurality of T-shaped pins abutting against the plurality of cams; and
- a plurality of springs disposed between the clamping mechanism head and the bottom ends of the plurality of T-shaped pins,
- wherein when the knob is rotated, the plurality of T-shaped pins move in unison with the cams.

30. The clamping mechanism of claim 27, further comprising:
- five cams disposed on the camshaft;
- five T-shaped pins abutted against the cams; and
- five springs disposed between the clamping mechanism head and the bottom ends of the T-shaped pins,
- wherein when the knob is rotated, the five T-shaped pins move in unison with the cams.

31. The clamping mechanism of claim 27, wherein the loadboard defines an eyelet hole that releasably engages the top end of the T-shaped pin so that, when the T-shaped pin retracts toward the top surface of the clamping mechanism head, the top end of the T-shaped pin draws the loadboard onto the test pin.

* * * * *